(12) United States Patent
Lee et al.

(10) Patent No.: US 10,824,054 B2
(45) Date of Patent: Nov. 3, 2020

(54) MOBILE TERMINAL

(71) Applicant: LG ELECTRONICS INC., Seoul (KR)

(72) Inventors: Changhwan Lee, Seoul (KR); Jinwon Kang, Seoul (KR); Hangtae Kim, Seoul (KR); Yunsup Shin, Seoul (KR); Minyoung Lee, Seoul (KR); Ayoung Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/377,098

(22) Filed: Apr. 5, 2019

(65) Prior Publication Data

US 2019/0235351 A1 Aug. 1, 2019

Related U.S. Application Data

(63) Continuation of application No. 15/877,317, filed on Jan. 22, 2018, now Pat. No. 10,295,157.

(30) Foreign Application Priority Data

Jul. 13, 2017 (KR) .......................... 10-2017-0089182

(51) Int. Cl.
*G03B 15/05* (2006.01)
*H05K 1/18* (2006.01)
(Continued)

(52) U.S. Cl.
CPC .......... *G03B 15/05* (2013.01); *H01S 5/02276* (2013.01); *H01S 5/02288* (2013.01);
(Continued)

(58) Field of Classification Search
CPC ...... F21V 19/0025; F21V 29/70; H01L 33/64; H05K 1/0203; H05K 1/181; F21K 9/69
See application file for complete search history.

(56) References Cited

U.S. PATENT DOCUMENTS 9,343,441 B2 ‡ 5/2016 Reiherzer ........... H01L 25/0753
9,735,198 B2 ‡ 8/2017 Joo ....................... H01L 33/486
(Continued)

FOREIGN PATENT DOCUMENTS

CN   201796950   4/2011
CN   103190006   7/2013
(Continued)

OTHER PUBLICATIONS

Korean Intellectual Property Office Application No. 10-2017-0089182, Office Action dated Oct. 30, 2018, 7 pages.‡
(Continued)

*Primary Examiner* — Anne M Hines
(74) *Attorney, Agent, or Firm* — Lee, Hong, Degerman, Kang & Waimey

(57) ABSTRACT

A lighting device includes a printed circuit board (PCB), a submount mounted on the PCB, a die mounted on the submount and including a plurality of light emitting devices, and a pad inserted into a hole formed in the submount such that the die and the PCB are electrically connected through the submount, connected to the die by a wire bonding, and electrically connected to the PCB.

17 Claims, 19 Drawing Sheets

Related U.S. Application Data

(60) Provisional application No. 62/449,599, filed on Jan. 24, 2017.

(51) Int. Cl.
| | |
|---|---|
| *H05K 1/02* | (2006.01) |
| *H01S 5/022* | (2006.01) |
| *H05K 1/14* | (2006.01) |
| *H01S 5/024* | (2006.01) |
| *H01S 5/42* | (2006.01) |
| *H04B 1/3827* | (2015.01) |
| *H01S 5/042* | (2006.01) |

(52) U.S. Cl.
CPC ...... *H01S 5/02296* (2013.01); *H01S 5/02469* (2013.01); *H01S 5/423* (2013.01); *H05K 1/0203* (2013.01); *H05K 1/144* (2013.01); *H05K 1/181* (2013.01); *H01S 5/04256* (2019.08); *H04B 1/3827* (2013.01); *H05K 2201/042* (2013.01); *H05K 2201/10121* (2013.01); *H05K 2201/10287* (2013.01); *H05K 2201/10356* (2013.01); *H05K 2201/10424* (2013.01)

(56) References Cited

U.S. PATENT DOCUMENTS

| | | | | |
|---|---|---|---|---|
| 9,780,268 | B2 ‡ | 10/2017 | Hussell | H01L 33/62 |
| 10,134,961 | B2 ‡ | 11/2018 | Reiherzer | H01L 33/52 |
| 2007/0228387 | A1 ‡ | 10/2007 | Negley | H01L 33/486 |
| | | | | 257/79 |
| 2008/0191231 | A1 * | 8/2008 | Park | H01L 25/0753 |
| | | | | 257/98 |
| 2008/0251707 | A1 ‡ | 10/2008 | Kathman | G02B 6/4204 |
| | | | | 250/23 |
| 2011/0024785 | A1 ‡ | 2/2011 | Ng | H01L 33/642 |
| | | | | 257/99 |
| 2011/0228514 | A1 ‡ | 9/2011 | Tong | H01L 25/0753 |
| | | | | 362/84 |
| 2011/0316024 | A1 ‡ | 12/2011 | Hung | H01L 33/486 |
| | | | | 257/98 |
| 2012/0104426 | A1 ‡ | 5/2012 | Chan | H01L 25/0753 |
| | | | | 257/89 |
| 2013/0039050 | A1 ‡ | 2/2013 | Dau | G02B 6/0045 |
| | | | | 362/218 |
| 2018/0209616 | A1 | 7/2018 | Lee et al. | |

FOREIGN PATENT DOCUMENTS

| | | | |
|---|---|---|---|
| CN | 106104798 | | 11/2016 |
| EP | 2500956 | ‡ | 9/2012 |
| JP | 2009105240 | ‡ | 5/2009 |
| JP | 2013127995 | ‡ | 6/2013 |
| KR | 101161461 | ‡ | 7/2012 |
| KR | 1020130105381 | ‡ | 9/2013 |
| KR | 1020150013052 | ‡ | 2/2015 |
| KR | 1020170005649 | ‡ | 1/2017 |
| WO | 2011122530 | | 10/2011 |
| WO | WO-2011122530 | ‡ | 10/2011 |

OTHER PUBLICATIONS

Korean Intellectual Property Office Application No. 10-2017-0089182, Office Action dated May 18, 2018, 6 pages.‡
PCT International Application No. PCT/KR2018/000679, Notification of Transmittal of the International Search Report and the Written Opinion of the International Searching Authority, or Declaration dated May 23, 2018, 12 pages.‡
European Patent Office Application Serial No. 18152289.7, Search Report dated May 28, 2018, 9 pages.‡
U.S. Appl. No. 15/877,317, Notice of Allowance dated Jan. 7, 2019, 13 pages.
State Intellectual Property Office of the People's Republic of China Application Serial No. 201810067057.1, Office Action dated Dec. 2, 2019, 16 pages.

\* cited by examiner
‡ imported from a related application

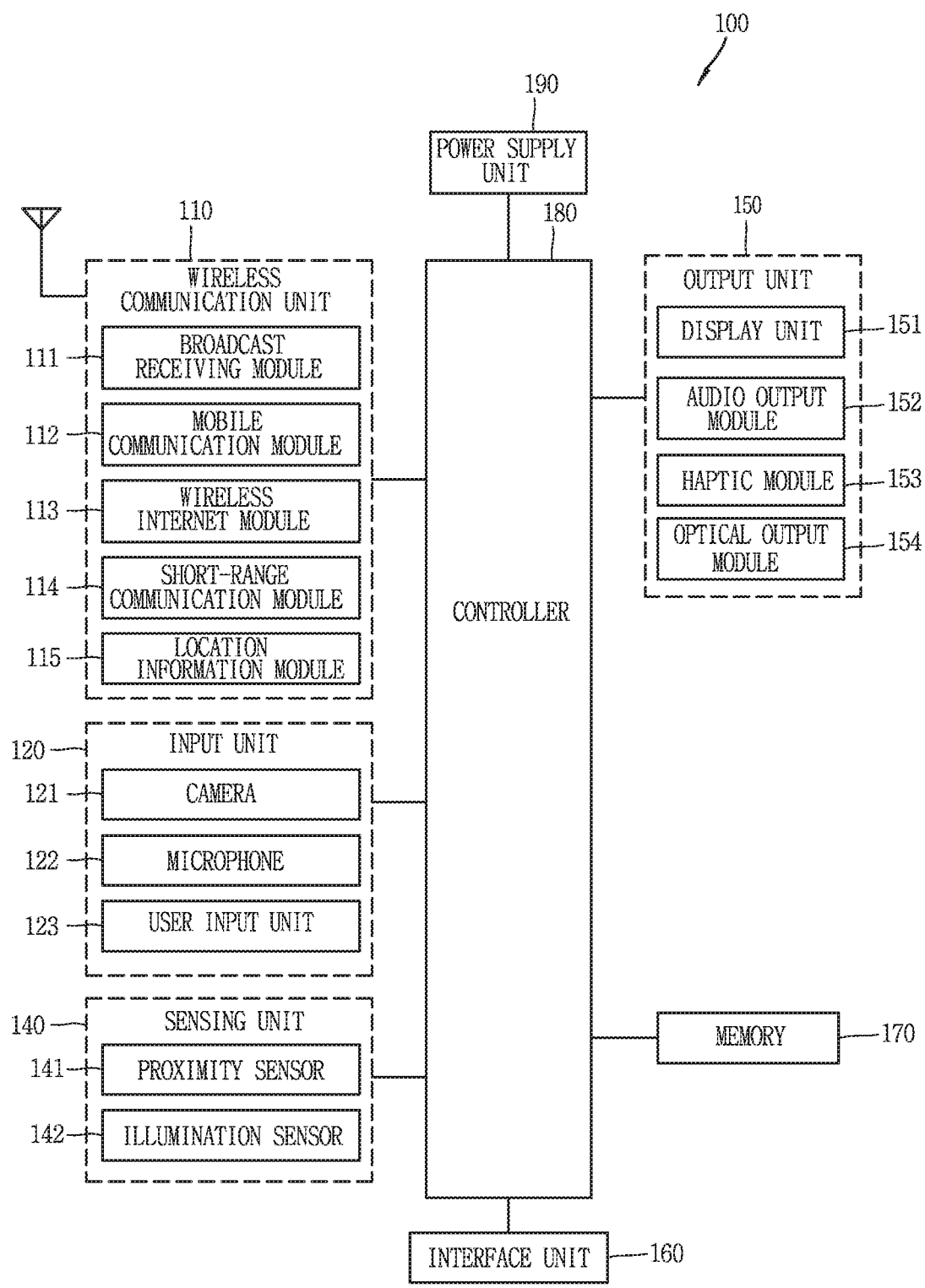

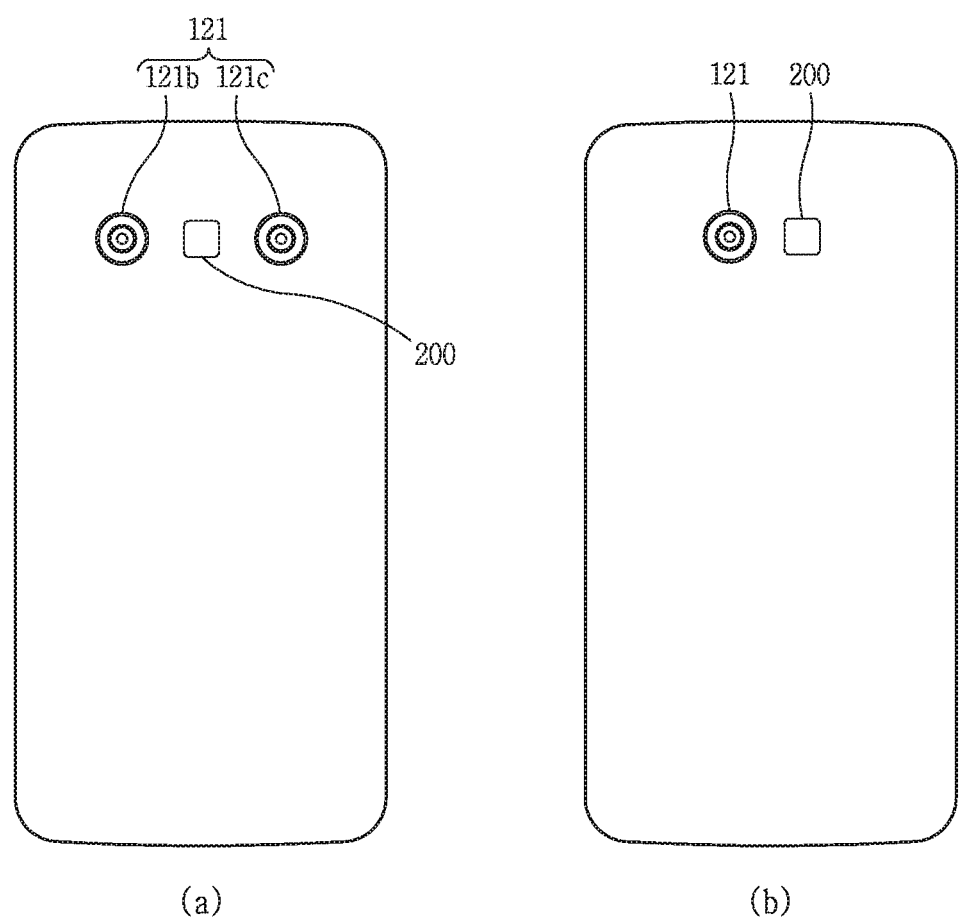

FIG. 4
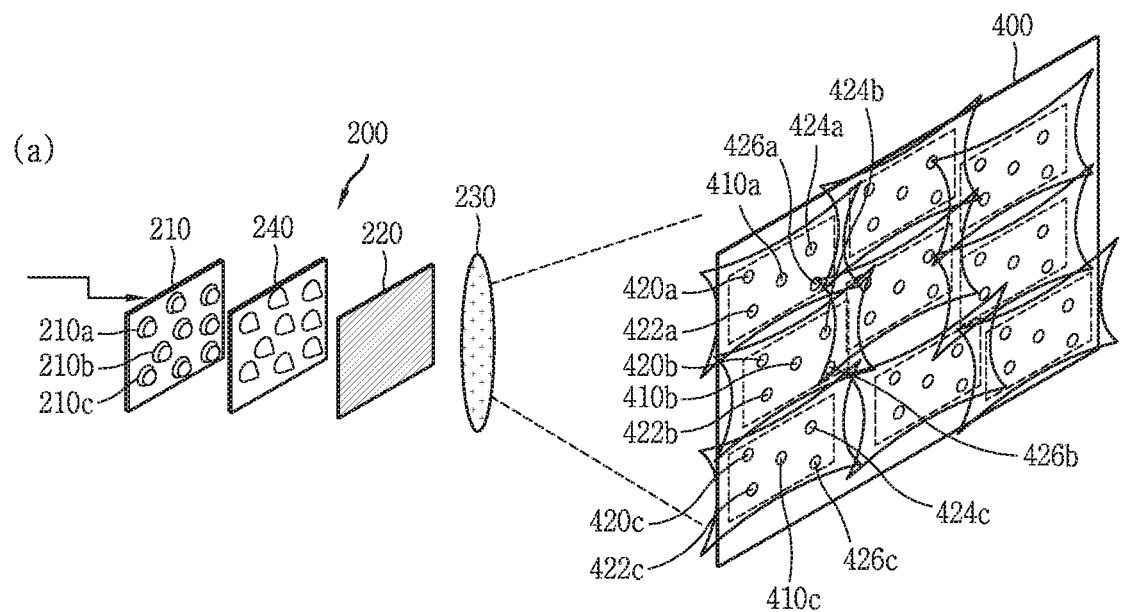
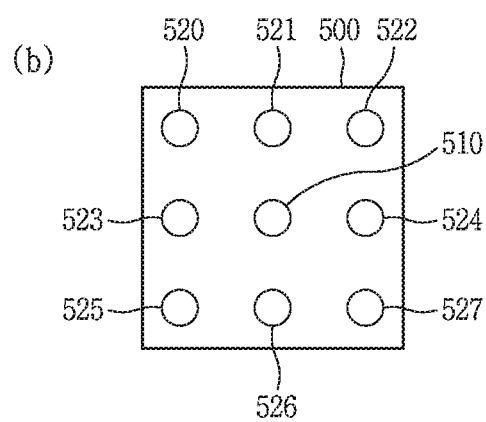

← Heat row path

← Heat row path

← Heat row path

← Heat row path

FIG. 16A
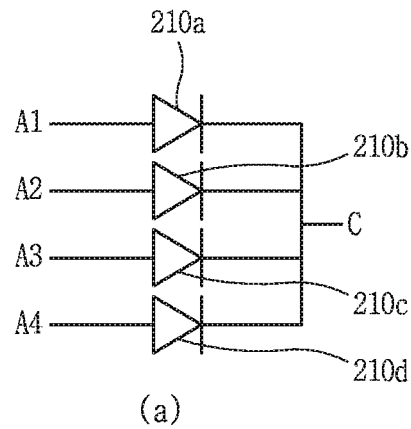
(a)
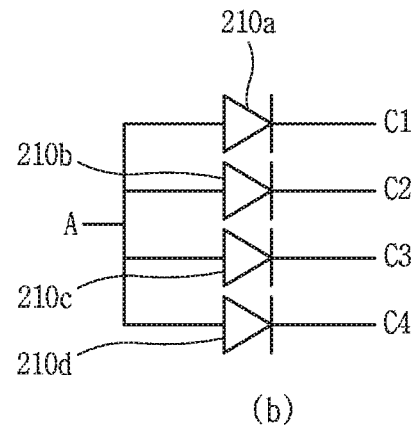
(b)
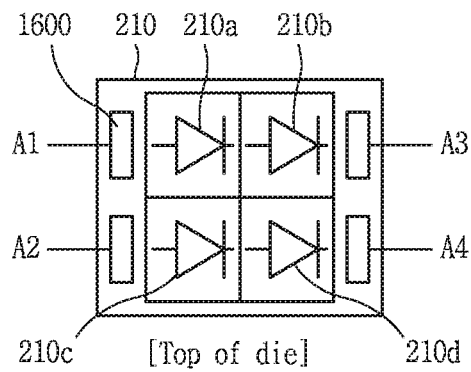
(c)
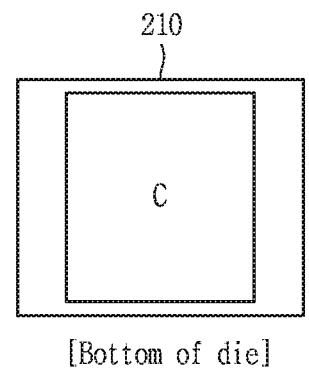
(d)

FIG. 19
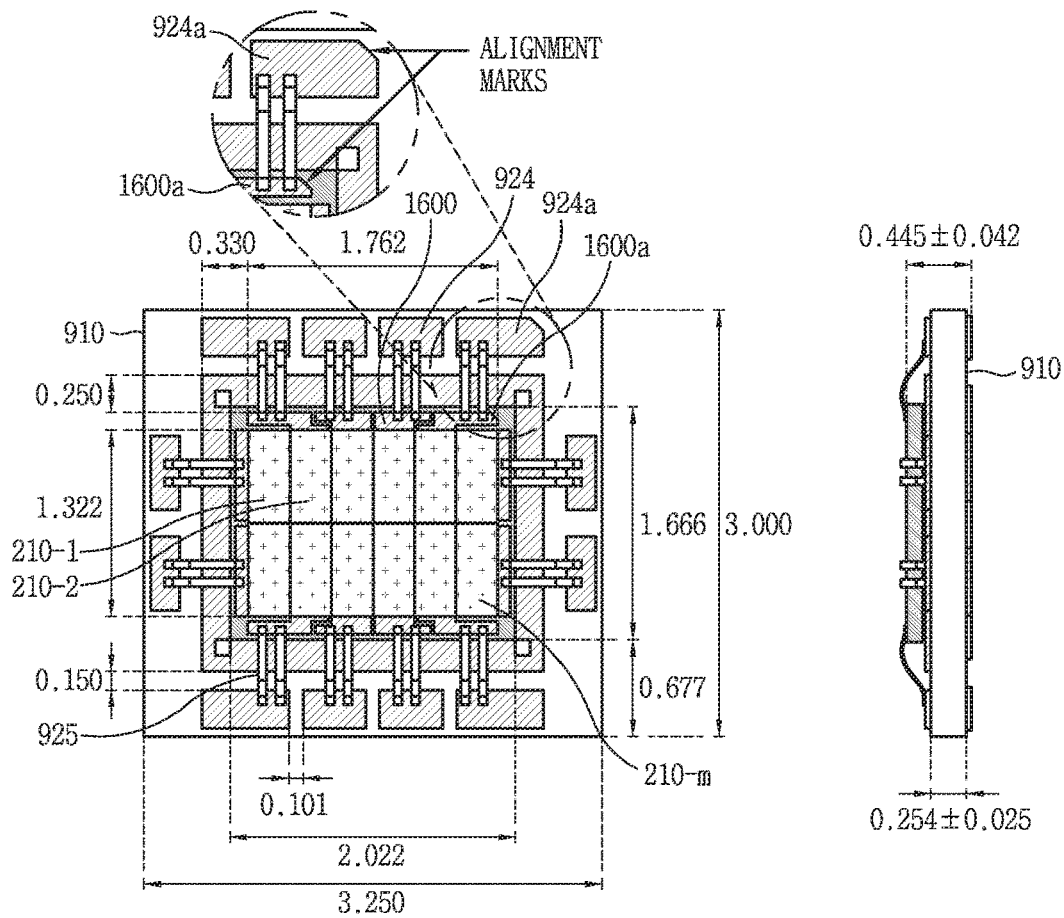
[Top of die]
(a)
[Side of die]
(b)
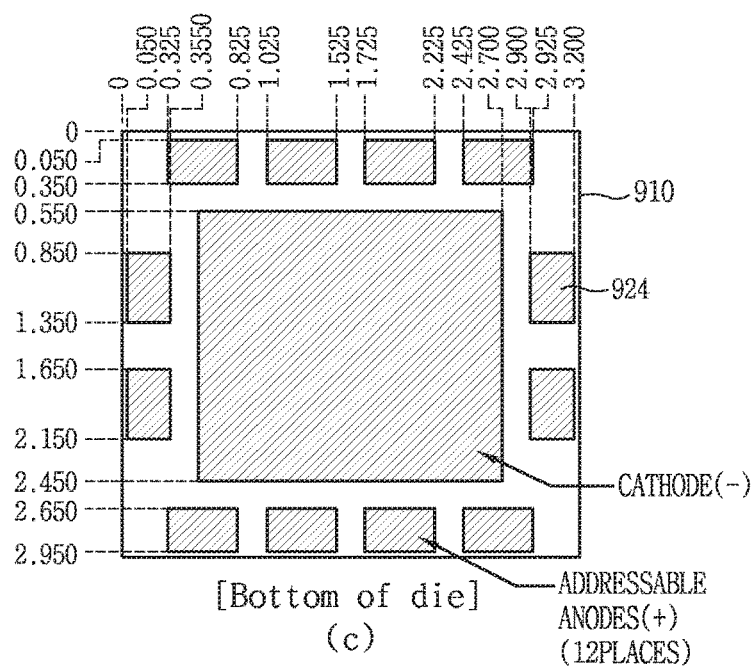
[Bottom of die]
(c)
ADDRESSABLE
ANODES(+)
(12 PLACES)

MOBILE TERMINAL

CROSS-REFERENCE TO RELATED APPLICATION

This application is a continuation of U.S. patent application Ser. No. 15/877,317, filed on Jan. 22, 2018, now U.S. Pat. No. 10,295,157, which claims the benefit of earlier filing date and right of priority to Korean Application No. 10-2017-0089182, filed on Jul. 13, 2017, and also claims the benefit of U.S. Provisional Application No. 62/449,599, filed on Jan. 24, 2017, the contents of which are all hereby incorporated by reference herein in their entireties.

BACKGROUND OF THE INVENTION

1. Field of the Invention

The present disclosure relates to a mobile terminal including a lighting device, and particularly, to a mobile terminal having a lighting device used to capture a 3D image.

2. Background of the Invention

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. More recently, mobile terminals have been configured to receive broadcast and multicast signals which permit viewing of content such as videos and television programs.

As functions of the terminal become more diversified, the terminal can support more complicated functions such as capturing images or video, reproducing music or video files, playing games, receiving broadcast signals, and the like. By comprehensively and collectively implementing such functions, the mobile terminal may be embodied in the form of a multimedia player or a device.

Recently, as performance of cameras have advanced, various functions using cameras have been developed. For example, development of functions to capture a high quality still image or video or generate a 3D image using depth information (or a depth value) of an image received through a camera have been actively developed.

For those various functions using cameras, a role of a light emitting device is important. Here, the light emitting device serves to emit light to a space corresponding to an image received through a camera.

Thus, the necessity to develop a light emitting device for performing various functions using a camera and a method for controlling a light emitting device have emerged.

SUMMARY OF THE INVENTION

Therefore, an aspect of the detailed description is to provide a mobile terminal including a lighting device capable of irradiating light, which is used for extracting depth information of an image captured through a camera, in an optimized manner.

Another aspect of the detailed description is to provide a mobile terminal including a lighting device formed to irradiate optical spots larger than the number of light sources to a subject in an optimized manner.

Another aspect of the detailed description is to provide a mobile terminal including a lighting device capable of diffracting light irradiated from a light source such that the number of optical spots per unit area is large.

Another aspect of the detailed description is to provide a mobile terminal including a lighting device having a minimized volume.

Another aspect of the detailed description is to provide a mobile terminal including a lighting device capable of dissipating heat, which is generated by a plurality of light emitting devices, in an optimized manner.

To achieve these and other advantages and in accordance with the purpose of this specification, as embodied and broadly described herein, a lighting device includes: a printed circuit board (PCB); a submount mounted on the PCB; a die mounted on the submount and including a plurality of light emitting devices; and a pad inserted into a hole formed in the submount such that the die and the PCB are electrically connected through the submount, connected to the die by a wire bonding, and electrically connected to the PCB.

The plurality of light emitting devices provided in the die and the PCB may be electrically connected by penetrating through the submount through the pad inserted into the submount.

The lighting device may further include: a holder provided on the PCB and formed to cover the die and the submount.

The holder may be provided to have an internal space between the die and the holder.

The lighting device may further include: a diffractive optical element (DOE) disposed in the internal space and disposed by the holder.

The lighting device may further include: a holder disposed on the submount, provided to cover the die, and having an internal space.

Heat generated in the die may be dissipated through a side surface of the submount and the PCB.

The die may be disposed on one surface of the PCB, the submount may be mounted on the other surface of the PCB opposing the one surface of the PCB on which the die is disposed, and the lighting device may further include: a heat dissipation member inserted into a hole provided in the PCB such that heat generated in the die is transmitted to the submount through the PCB, and connected to one surface of the PCB and the submount mounted on the other surface of the PCB.

The lighting device may further include: a holder disposed on one surface of the PCB, provided to cover the die, and having an internal space.

The submount may be provided such that an area thereof in contact with the die and an area thereof in contact with the PCB are equal, and the die may be directly electrically connected to the PCB by a wire bonding.

The die may be disposed on a first PCB formed as a metal member, the die and the first PCB may be connected by a wire bonding, and the lighting device may further include a second PCB disposed to be spaced apart from the first PCB by a predetermined distance and electrically connected to the first PCB through a cable.

The lighting device may further include: a holder disposed on the first PCB, provided to cover the die, and having an internal space.

A plurality of anode electrodes electrically connected to the plurality of light emitting devices may be provided on one surface of the die, and a single cathode electrode electrically connected to the plurality of light emitting devices may be provided on the other surface opposing the one surface of the die.

The plurality of anode electrodes and the pad may be connected by a wire bonding.

A plurality of cathode electrodes electrically connected to the plurality of light emitting devices may be provided on one surface of the die, and a single anode electrode electrically connected to the plurality of light emitting devices may be provided on the other surface opposing the one surface of the die.

A lens allowing light output from the plurality of light emitting devices provided in the die to transmit therethrough may be provided in the holder.

The lens may be a telecentric lens.

The die may include a plurality of sub-dies, the plurality of light emitting devices may be disposed in the plurality of sub-dies, and the plurality of sub-dies may be disposed in a 2 columns and n rows or n columns and 2 rows.

A mobile terminal according to an embodiment of the present disclosure may include a lighting device described in this disclosure.

According to the present disclosure, since the die and the PCB are electrically connected through the submount, a configuration for wire-bonding the submount and the PCB may be omitted. That is, such a configuration of wire-bonding the submount and the PCB as in the related art may not be necessary.

Accordingly, a volume required for wire-bonding the submount and the PCB is reduced, minimizing a volume of the lighting device.

Also, the present disclosure may provide a new lighting device including various structures capable of effectively dissipating heat generated by the plurality of light emitting devices.

Further scope of applicability of the present application will become more apparent from the detailed description given hereinafter. However, it should be understood that the detailed description and specific examples, while indicating preferred embodiments of the invention, are given by way of illustration only, since various changes and modifications within the scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings:

FIG. 1A is a block diagram of a mobile terminal in accordance with the present disclosure.

FIG. 2 is a conceptual view illustrating a camera and a lighting device provided in a mobile terminal related to the present disclosure.

FIG. 4 is a conceptual view illustrating a lighting device provided in a mobile terminal according to an embodiment of the present disclosure.

FIGS. 16A and 16B are conceptual views illustrating a structure in which a plurality of light emitting devices and a pad are connected according to an embodiment of the present disclosure.

FIGS. 18 and 19 are conceptual views illustrating a structure of a die according to an embodiment of the present disclosure.

DETAILED DESCRIPTION OF THE INVENTION

Figure 1B:
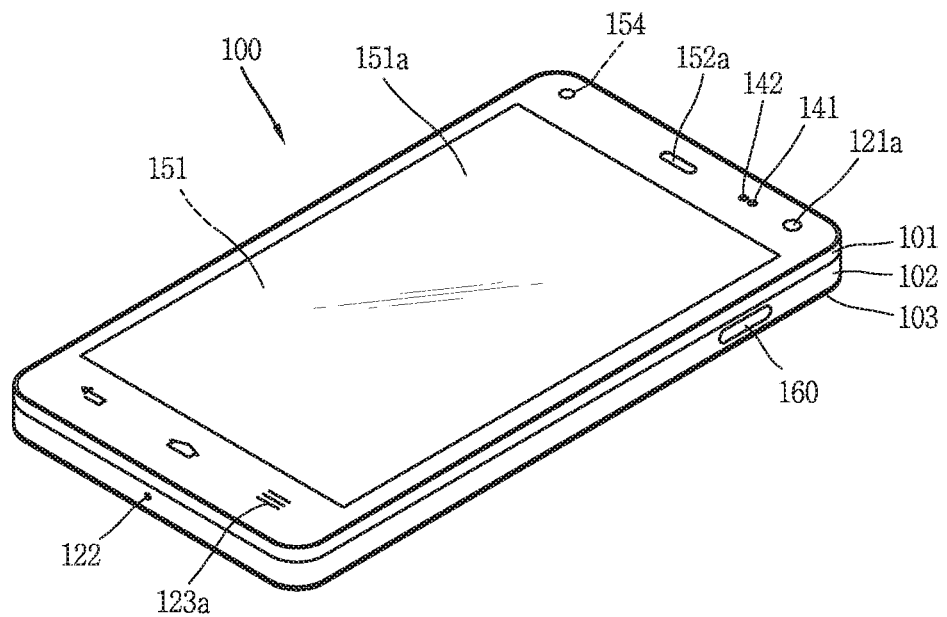
FIGS. 1B and 1C are conceptual views of one example of the mobile terminal, viewed from different directions.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1C:
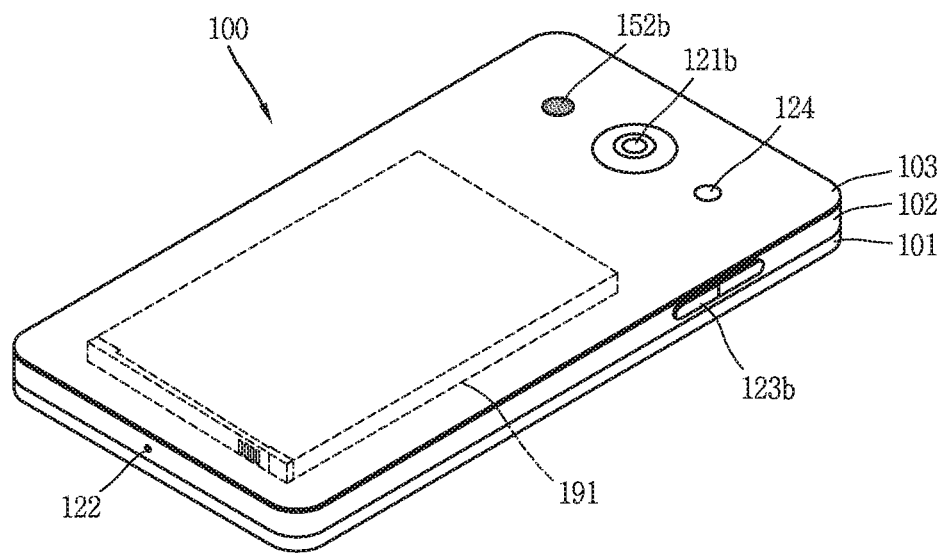

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a control unit 180, and a power supply unit 190. It is understood that implementing all of the illustrated components is not a requirement, and that greater or fewer components may alternatively be implemented.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server.

Further, the wireless communication unit 110 typically includes one or more modules which connect the mobile terminal 100 to one or more networks. To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by control unit 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the control unit 180 to perform an operation (or function) for the mobile terminal 100.

The control unit 180 typically functions to control overall operation of the mobile terminal 100, in addition to the operations associated with the application programs. The control unit 180 may provide or process information or functions appropriate for a user by processing signals, data, information and the like, which are input or output by the various components depicted in FIG. 1A, or activating application programs stored in the memory 170. As one example, the control unit 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least some of the above components may operate in a cooperating manner, so as to implement an operation or a control method of a glass type terminal according to various embodiments to be explained later. The operation or the control method of the glass type terminal may be implemented on the glass type terminal by driving at least one application program stored in the memory 170.

Referring still to FIG. 1A, various components depicted in this figure will now be described in more detail.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the control unit 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the control unit 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The control unit 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, control unit 180 processes data corresponding to proximity touches and proximity touch patterns sensed by the proximity sensor 141, and cause output of visual information on the touch screen. In addition, the control unit 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the control unit 180. Accordingly, the control unit 180 may sense which region of the display unit 151 has been touched. Here, the touch controller may be a component separate from the control unit 180, the control unit 180, and combinations thereof.

In some embodiments, the control unit 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The control unit 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the control unit. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the control unit 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The control unit 180 may typically control the general operations of the mobile terminal 100. For example, the control unit 180 may set or release a lock state for restricting a user from inputting a control command with respect to applications when a status of the mobile terminal meets a preset condition.

The control unit 180 can also perform the controlling and processing associated with voice calls, data communications, video calls, and the like, or perform pattern recognition processing to recognize a handwriting input or a picture drawing input performed on the touch screen as characters or images, respectively. In addition, the control unit 180 can control one or a combination of those components in order to implement various exemplary embodiments disclosed herein.

The power supply unit 190 receives external power or provide internal power and supply the appropriate power required for operating respective elements and components included in the mobile terminal 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, the first audio output module 152a, the second audio output module 152b, the proximity sensor 141, the illumination sensor 142, the optical output module 154, the first camera 121a, the second camera 121b, the first manipulation unit 123a, the second manipulation unit 123b, the microphone 122, the interface unit 160, etc.

Hereinafter, the mobile terminal 100 will be explained with reference to FIGS. 1B and 1C. The display unit 151, the first audio output module 152a, the proximity sensor 141, the illumination sensor 142, the optical output module 154, the first camera 121a and the first manipulation unit 123a are arranged on the front surface of the terminal body. The second manipulation unit 123b, the microphone 122 and the interface unit 160 are arranged on the side surfaces of the terminal body. The second audio output module 152b and the second camera 121b are arranged on the rear surface of the terminal body.

However, it is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 outputs information processed in the mobile terminal 100. For example, the display unit 151 may display information on an execution screen of an application program driven in the mobile terminal 100, or a User Interface (UI) or a Graphic User Interface (GUI) associated with such execution screen information.

The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the control unit 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output unit 152a may be implemented as a receiver for transmitting a call sound to a user's ears, and the second audio output unit 152b may be implemented as a loud speaker for outputting each type of alarm sounds or a play sound of multimedia.

It may be configured such that the sounds generated from the first audio output module 152a are released along an assembly gap between the structural bodies (e.g., between the window 151a and the front case 101). In this case, a hole independently formed to output audio sounds may not be seen or hidden in terms of appearance, thereby further simplifying the appearance of the mobile terminal 100.

The optical output module 154 can output a signal for indicating an event generation using light of a light source. Examples of events generated in the mobile terminal 100 may include message reception, call signal reception, a missed call, an alarm, a schedule notice, an email reception, information reception through an application, and the like. A signal output by the optical output module 154 may be implemented in such a manner that the mobile terminal emits monochromatic light or light with a plurality of colors. The signal output may be terminated as the mobile terminal senses that a user has checked the generated event, for example.

The first camera 121a processes image data of still pictures or video acquired by an image capture device in a video capturing mode or an image capturing mode. The processed image frames may be displayed on the display unit 151, or may be stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may be implemented in a user's non-tactile manner, e.g., by a proximity touch, a hovering touch, etc.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The control unit 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121*b* is implemented as an array camera, images may be captured in various manners using the plurality of lenses and images with better qualities.

As shown in FIG. 1C, a flash 124 is shown adjacent to the second camera 121*b*. When an image of a subject is captured with the camera 121*b*, the flash 124 may illuminate the subject.

As shown in FIG. 1B, the second audio output module 152*b* can be located on the terminal body. The second audio output module 152*b* may implement stereophonic sound functions in conjunction with the first audio output module 152*a*, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 (refer to FIG. 1A) may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Meanwhile, the mobile terminal related to the present disclosure may extract (detect, determine, sense) depth information from an image captured through a camera, using the camera and a lighting device.

Also, the mobile terminal related to the present disclosure may capture (or generate) a 3D image using the camera and the lighting device. For example, the mobile terminal related to the present disclosure may convert (generate) a 2D image captured through the camera into a 3D image on the basis of the extracted depth information. In another example, the mobile terminal related to the present disclosure may determine a distance to a subject on the basis of light irradiated from the lighting device and capture (or generate) a 3D image through the camera on the basis of the distance to the subject.

Hereinafter, a method for extracting depth information from an image captured using the camera and the lighting device will be described in detail with reference to the accompanying drawings. Hereinafter, extracting depth information from an image captured through the camera will be described, but related contents may also be inferred and applied to capturing (or generating a 3D image in the same or similar manner.

The mobile terminal 100 related to the present disclosure may extract depth information received (or captured) through the camera 121 (please refer to FIG. 1A).

The image received through the camera may be referred to as a preview image. In detail, the preview image may refer to an image received through the camera in real time. The preview image may be changed as the mobile terminal having the camera 121 is moved by an external force or as a subject moves.

An image captured through the camera may refer to an image obtained by capturing a preview image, for example. For example, the image may be captured as an image capture button output on the display unit of the mobile terminal is touched, as a user's gesture associated to capture a preview image is sensed through the preview image, or as a physical button provided in the mobile terminal is pressed.

An image described in this disclosure may refer to at least one of a preview image and a captured image.

Depth information described in this disclosure may be a depth value. The depth information may refer to a distance (or a distance value) between a subject corresponding pixels included in the image and the mobile terminal (specifically, the camera).

For example, in cases where a subject corresponding to a specific pixel of the image and the mobile terminal is n, depth information of the specific pixel may be a specific value corresponding to n. The specific value corresponding to n may be n or a value converted by a preset algorithm.

Also, the depth information may be a value corresponding to a z axis perpendicular to an x axis and a y axis in cases where coordinates of the image are set to the x axis and the y axis perpendicular to the x axis. An absolute value of the depth information may be increased as a distance between the subject and the mobile terminal is increased.

The depth information may be utilized in various fields. For example, the depth information may be used for capturing/generating a 3D stereoscopic image (stereoscopy), used for generating 3D printing data used in a 3D printer, or used for detecting movement of an object (or subject) around the mobile terminal.

The mobile terminal related to the present disclosure may extract depth information of an image received (or captured) through the camera in various manners. For example, the controller 180 may extract depth information through a stereo vision scheme of extracting depth information using at least two cameras, a structure light scheme of extracting depth information using light emitting devices disposed to form a preset pattern, a time of flight (ToF) scheme of extracting depth information on the basis of time during which light emitted from a light emitting device is reflected to be returned, or any combination thereof.

Hereinafter, extracting depth information using the structure light scheme, among the aforementioned schemes, will be largely described.

The structure light scheme is a scheme of emitting light to a subject by controlling a plurality of light emitting devices disposed to have a preset pattern, sensing light reflected from the subject, and subsequently extracting depth information on the basis of the sensed light (or a pattern of sensed light).

In detail, the structure light scheme is a scheme of extracting depth information by irradiating light to a subject from a plurality of light emitting devices disposed to have a preset pattern and calculating a shift amount (or a shift amount of a reflected light pattern) of reflected light returned with respect to the preset pattern.

For example, the controller 180 of the mobile terminal related to the present disclosure controls the plurality of light emitting devices disposed to have a preset pattern to emit light to the subject. Thereafter, the controller 180 of the mobile terminal may sense light reflected and returned from the subject through the sensing unit 140 of FIG. 1A.

Here, the controller 180 may extract depth information of an image received through the camera 121. For example, the controller 180 may extract depth information of the image received through the camera 121 by comparing the pattern formed by light which is reflected and returned with the preset pattern.

In detail, the controller 180 may extract depth information of the image received through the camera 121 by comparing a preset pattern in which a plurality of light emitting devices emit light to the subject (or a preset pattern in which the plurality of light emitting devices are disposed) and a pattern formed by reflected and returned light (or optical spot) and calculating a shift amount regarding each of the reflected and returned light (or optical spot) with respect to the preset pattern (or a changed form, a changed distance, a changed direction, and the like) or a shift amount regarding a pattern of returned light.

In another example, in the structure light scheme, the controller 180 may extract depth information of the image received through the camera 121 by comparing time during which light emitted from the plurality of light emitting devices is reflected to be returned and strength of reflected and returned light.

To this end, the plurality of light emitting devices may be formed to emit light to a space corresponding to the image received through the camera 121.

The preset pattern may be determined (or set) by the user or may be predetermined when a product of the mobile terminal was manufactured. Also, the preset pattern may be changed according to a user request or by controlling of the controller.

Also, the plurality of light emitting devices may emit infrared light. Also, the light emitting devices may be laser diodes changing an electrical signal into an optical signal. For example, the light emitting devices may be a vertical cavity surface emitting laser (VCSEL).

In the present disclosure, depth information of the image may be extracted through one camera (infrared camera or a 3D camera) using the structure light scheme, and even when the subject has a single color, depth information may be extracted. Also, accuracy regarding depth information may be enhanced by combining the structure light scheme and a stereo vision scheme using at least two cameras or combining the structure light scheme and the ToF scheme.

The ToF scheme may be a scheme of measuring depth information of an image by calculating a time during which light directly irradiated to an object is returned as reflected light The stereo vision scheme may be a scheme of symmetrically disposing a plurality of cameras (e.g., two cameras) and extracting depth information of an image received through the camera using disparity (or a difference in distance, space) between an image received through a first camera (e.g., a left camera) among the plurality of cameras and an image received through a second camera (e.g., a right camera) among the plurality of cameras.

The mobile terminal related to the present disclosure may use a combination of the stereo vision scheme and the structure light scheme.

FIG. 2 is a conceptual view illustrating a camera and a lighting device provided in a mobile terminal related to the present disclosure.

As illustrated in (a) of FIG. 2, the mobile terminal related to the present disclosure may have a plurality of cameras 121b and 121c on one surface thereof. Here, one surface of the mobile terminal 100 may be at least one of a rear surface, a front surface, and a side surface of the main body of the mobile terminal.

In (a) of FIG. 2, it is illustrated that the plurality of cameras 121b and 121c are provided on the rear surface of the main body of the mobile terminal.

Also, a lighting device 200 of the present disclosure may be provided on one surface on which the plurality of cameras 121b and 121c are provided.

The lighting device 200 may include a plurality of light emitting devices, and as described above, the lighting device 200 may irradiate light having a preset pattern to extract depth information of an image through the structure light scheme. Here, the plurality of light emitting devices (or a plurality of light sources) may be, for example VCSEL.

As illustrated in (a) of FIG. 2, the mobile terminal of the present disclosure may extract depth information of an image received through the cameras by combining the stereo vision scheme and the structure light scheme using the plurality of cameras 121a and 121b and the lighting device 200 capable of irradiating light of a preset pattern.

However, without being limited thereto, although the plurality of cameras 121a and 121b are provided on one surface of the main body of the mobile terminal, the mobile terminal 100 of the present disclosure may extract depth information of an image received through the cameras using any one of the stereo vision scheme, the structure light scheme, and the ToF scheme or by combining at least two schemes.

However, without being limited thereto, as illustrated in (b) of FIG. 2, the mobile terminal 100 of the present disclosure may extract depth information of an image received through the camera using one camera 121 and the lighting device 200, using only the structure light scheme, using only the ToF scheme, or using a combination of the structure light scheme and the ToF scheme.

Meanwhile, the lighting device 200 provided in the mobile terminal 100 related to the present disclosure may irradiate light to form (or have) a predetermined pattern as described above in the structure light scheme. The lighting device 200 may include a plurality of light emitting devices. Here, the light emitting devices may be the aforementioned VCSEL.

The plurality of light emitting devices may be formed to have a preset pattern or only some of the light emitting devices may be turned on to irradiate light in a preset pattern.

The plurality of light emitting devices (or a die including the plurality of light emitting devices) may be referred to as a VCSEL array, for example.

The controller 180 of the mobile terminal related to the present disclosure may individually control each of the plurality of light emitting devices (the plurality of light sources) included in the lighting device 200. In detail, the controller 180 may individually turned on or off the plurality of light emitting devices provided in the lighting device 200. Also, the controller 180 may individually control emission intensity of the plurality of light emitting devices provided in the lighting device 200. Also, the controller 180 may individually control (determine) an emission timing of the plurality of light emitting devices provided in the lighting device 200.

The lighting device 200 may be individually turned on or off, varied in emission intensity, or changed in an emission timing under the control of the controller 180. Accordingly, a pattern (i.e., a preset pattern) of light irradiated from the lighting device 200 may be varied.

In this manner, in the lighting device 200 included in the mobile terminal of the present disclosure, a pattern (or intensity of light, a timing of light) of irradiated light may be varied by individually controlling the plurality of light emitting devices (the plurality of VCSELs), and in this point of view, the lighting device 200 may be referred to as active lighting.

Meanwhile, the lighting device 200 related to the present disclosure may irradiate light (or optical spot) of a preset pattern such that the light may be used for extracting depth information of an image. Here, the optical spot may refer to a region (or point) of a subject to which light is irradiated or a region (or a point) of the mobile terminal (or the lighting device 200, the camera, or the sensing unit) to which light reflected from a subject is irradiated.

Here, in the present disclosure, since the plurality of light emitting devices included in the lighting device 200 are laser diodes (e.g., VCSELs), and thus, when the plurality of light emitting devices emit light, light (laser) is irradiated to a narrow region (or point) of a subject. Accordingly, an optical spot may be formed in the subject. Also, in the present disclosure, on the basis of light (laser) reflected to be returned from the subject to the mobile terminal, an optical spot irradiated to the subject may be detected.

Meanwhile, the lighting device 200 may include a diffractive optical element (DOE). The DOE may be formed to diffract light (laser) output from the light emitting devices.

The DOE may diffract light output from the light emitting device into a plurality of light beams. In this disclosure, diffracting light (laser) may be understood as splitting light, duplicating light, refracting a portion of light, and the like. In cases where one light output from the light emitting device is diffracted (or split) into a plurality of light beams by the DOE, the sum of intensity of the plurality of light beams may be equal to intensity of the one light.

In other words, intensity of each of the plurality of light beams (i.e., any one of the plurality of light beams diffracted by the DOE) may be weaker than intensity of the one light beam before entering the DOE.

Meanwhile, the lighting device of the present disclosure may output a larger number of light beams (optical spots) than the number of the plurality of light emitting devices using the DOE.

For example, in cases where the number of the plurality of light emitting devices is n and the number of light beams (optical spots) output when one light beam passes through the DOE is m, the lighting device 200 of the present disclosure may output n*m number of light beams (optical spots) (or irradiate the n*m number of light beams to a subject).

In the present disclosure, the lighting device 200 may have a plurality of light emitting devices and a DOE, and the DOE may diffract light output from the plurality of light emitting devices such that a predetermined pattern is formed with respect to each of the plurality of light emitting devices.

That is, the lighting device 200 of the present disclosure may include the DOE for diffracting light such that each of the light sources has the predetermined pattern. In other words, the DOE included in the lighting device 200 may diffract light such that one light beam output from one light emitting device forms the predetermined pattern. Accordingly, a plurality of light beams output from the plurality of light emitting devices may be diffracted to form the predetermined pattern and pass through the DOE.

In contrast, a related art lighting device (or a related art DOE) is formed to diffract light output from a plurality of light emitting devices such that a plurality of patterns are formed by the plurality of light emitting devices.

The related art lighting technique will be described in detail with reference to FIG. 3.

Figure 3:
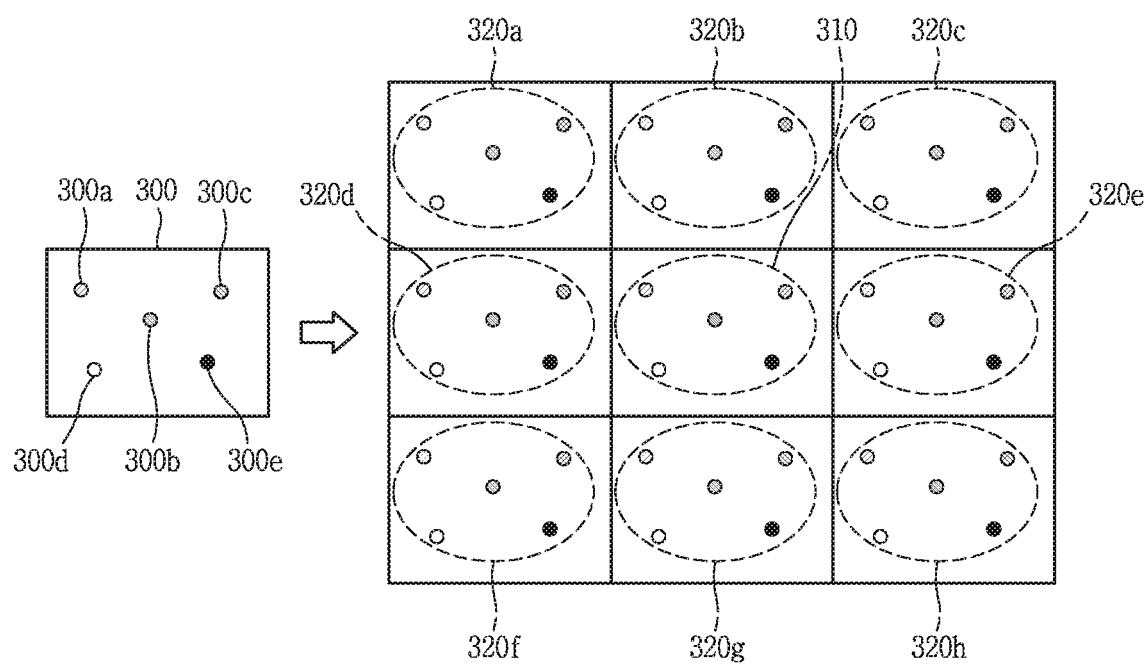
FIG. 3 is a conceptual view illustrating a related art lighting technology.

FIG. 3 is a conceptual view illustrating the related art lighting technique.

In FIG. 3, for the purposes of description, an embodiment in which light (or light pattern) incident to the DOE is duplicated 3 by 3.

Referring to FIG. 3, a light source unit 300 of the related art lighting device may include a plurality of light emitting devices 300a, 300b, 300c, 300d, and 300e. In the light source unit 300, the plurality of light emitting devices 300a, 300b, 300c, 300d, and 300e may be disposed to form a specific pattern, or only some of the plurality of light emitting devices 300a, 300b, 300c, 300d, and 300e, among a larger number of light emitting devices, may be turned on to form the specific pattern.

Here, when a plurality of light beams output from the plurality of light emitting devices pass through the DOE, the plurality of light beams may be split into a first type of light beam 310 not diffracted by the DOF and a second type of light beams 320a, 320b, 320c, 320d, 320e, 320f, 320g, 320h diffracted by the DOF.

When any one light beam is irradiated to the DOF, a portion of the light may pass through the DOF, without being diffracted by the DOF (or non-diffracted or refracted). That is, a portion of the light may pass through the DOF, in a state of maintaining straightness (or straightly), without being diffracted or refracted by the DOF.

In this manner, in this disclosure, the non-diffracted portion of light will be termed a first type of light. Here, the first type of light may refer to zero-order light (or $0^{th}$ light). Referring to FIG. 3, the number of first type of light beams 310 may be equal to the number of the plurality of light emitting devices 300a, 300b, 300c, 300d, 300e.

Meanwhile, when any one light beam is irradiated to the DOF, the other portion excluding the one portion of light beam is diffracted (or refracted) by the DOF. Here, the other remaining portion of light may be diffracted (or refracted) in a plurality of directions, i.e., in different directions. In the present disclosure, the other diffracted (or refracted) remaining portion of light will be termed a second type of light. Here, the second type of light may refer to a first-order light (or first light).

Referring to FIG. 3, the number of a plurality of second type of light beams 320a, 320b, 320c, 320d, 320e, 320f, 320g, 320h diffracted by the DOF may be varied depending on design of the DOF and may generally be larger than the number of a plurality of light emitting devices.

Here, the first type of light, which is zero-order light, and the second type of light, which is first-order light, may pass through one DOF, for example. For example, as illustrated in FIG. 3, in cases where light output from the plurality of light emitting devices passes through only one DOF, the corresponding light may include a first type of light (zero-order light) and a second type of light (first-order light).

Meanwhile, when light passes through at least two DOFs, the first type of light and the second type of light may include light of different orders.

For example, light output from a single optical element passes through a first DOF, the light may be split into non-diffracted zero-order light and diffracted first-order light.

Thereafter, when the zero-order light and the first-order light pass through a second DOF, the corresponding light which has passed through the second DOF may include zero-order light and first-order light which have not been diffracted by the second DOF and first-order light and second-order light which have been diffracted by the second DOF. Here, the diffracted first-order light may be light which has been diffracted from the zero-order light, and the diffracted second-order light may be light which has been diffracted from the first-order light.

Here, the first type of light may include zero-order light and first-order light which has not been diffracted by the second DOF after passing through the first DOF. Also, the second type of light may include first-order light and second-order light which have been diffracted by the second DOF after passing through the first DOF.

That is, the first type of light described in this disclosure may refer to light which is not diffracted by a final DOF, when at least one DOF is provided.

Also, the second type of light may refer to light diffracted by the final DOF.

That is, the first type of light may include light not diffracted by the final DOF, among a plurality of light beams irradiated to a subject. Also, the second type of light may include light diffracted by the final DOF, among the plurality of light beams irradiated to the subject.

In the related art, as illustrated in FIG. 3, the lighting device (or the DOF) may duplicate a light pattern by patterns (or in units of patterns) formed by a plurality of light emitting devices. In detail, the related art lighting device may diffract (duplicate) a light pattern emitted from the plurality of light emitting devices by the DOF such that light patterns do not overlap by patterns.

To this end, the related art lighting device includes a DOF formed such that an angle between the first type of light (e.g., zero-order light) and the second type of light (e.g., the first-order light) is an angle at which a pattern formed by the first type of light and a pattern of the second type of light do not overlap.

Accordingly, a pattern formed by the plurality of light emitting devices, a pattern formed by the first type of light 310, and patterns formed respectively by the second type of light beams 320a, 320b, . . . 320h may be the same as illustrated in FIG. 3.

Also, the related art lighting device may irradiate light such that the pattern formed by the first type of light 310 and the patterns formed by the second type of light beams (320a, 320b, . . . , 320h) do not overlap each other.

In other words, the related art lighting device may have a DOF irradiating light such that a region to which the first type of light 310 is irradiated (or a region formed by connecting points to which the first type of light is irradiated) and regions to which the second type of light beams 320a, 320b, . . . , 320h are irradiated (or a region formed by connecting points to which the second type of light is irradiated) do not overlap each other.

That is, the related art lighting device simply duplicates a pattern formed by light output from the plurality of light emitting devices into a plurality of light beams by patterns and irradiate the same such that the patterns do not overlap, whereby the related lighting device merely serves to expand a field of view (FOV) to which light is irradiated, while irradiating optical spots greater than the number of the plurality of light emitting devices.

Accordingly, in the related art, since the first type of light and the second type of light are irradiated to the subject such that they do not overlap each other, it is impossible to increase the number of light beams (optical spots) irradiated per unit area (that is, it is impossible to increase density of light (optical spots)).

In other words, as illustrated in FIG. 3, since the related art lighting device duplicates a pattern of light output from the plurality of light emitting devices 300a, 300b, . . . , 300e not to overlap by patterns, thereby merely increasing the number of output light beams (optical spots) and the FOV to which light is irradiated, without changing density of light indicating the number of light beams (optical spots) per unit area.

Meanwhile, the present disclosure provides a lighting device capable of irradiating light such that the number of light beams (optical spots) irradiated per unit area is increased (that is, such that density of light (optical spots) is increased).

Hereinafter, a lighting device related to the present disclosure will be described in detail with reference to the accompanying drawings.

FIG. 4 is a conceptual view illustrating a lighting device provided in a mobile terminal according to an embodiment of the present disclosure, and FIGS. 5, 6, 7, and 8 are conceptual views illustrating a lighting technology using a lighting device of the present disclosure.

First, referring to (a) of FIG. 4, a lighting device 200 related to the present disclosure may include a plurality of light emitting devices 210a, 210b, 210c, . . . and a DOE 220 diffracting a portion of light output from each of the plurality of light emitting devices.

The plurality of light emitting devices may be laser diodes and, for example, may be vertical cavity surface emitting lasers (VCSELs).

The plurality of light emitting devices may be provided in a die and may be disposed to form a specific pattern or at least some of the plurality of light emitting devices forming the specific pattern may be turned on. The specific pattern may be determined when the lighting device is generated or may be varied by changing light emitting devices which are turned on.

The die including the plurality of light emitting devices 210a, 210b, 210c, . . . may be termed a light emitting unit 210. Hereinafter, the plurality of light emitting devices may be denoted by the reference numerals 210a, 210, 210c, . . . , and the die including the plurality of light emitting devices will be denoted by reference numeral 210.

The DOF 220 may be disposed in a direction in which the plurality of light emitting devices output light. The DOF 220 may diffract a portion of light output from the light emitting devices and do not diffract the other remaining portion of light. That is, the DOF 220 may diffract a portion of light output form the light emitting devices and allow the same to pass therethrough, and allow the other remaining portion of light to pass therethrough in a non-diffracted state (that is, straightly).

Referring to (a) of FIG. 4, light output from the plurality of light emitting devices and passing through the DOF 220 may include a plurality of first type of light beams 410a, 410b, 410c, . . . not diffracted by the DOF 220 and a plurality of second type of light beams 420a, 422a, 424a, 426a, 420b, 422b, 424b, 426b, 420c, 422c, 424c, 426c, . . . diffracted by the DOF 220.

The plurality of first type of light beams may refer to light beams passing through the DOF 220 straightly (without being diffracted) after being output from the plurality of light emitting devices. Also, the plurality of second type of light beams may refer to light beams diffracted by the DOF 220 and passing through the DOF 220 after being output from the plurality of light emitting devices.

The DOF 220 may diffract (split) one light into a plurality of light beams. Here, the DOF 220 may diffract light to have a specific pattern with respect to each of the light emitting devices, rather than diffracting light by patterns in a state of maintaining patterns of a plurality of light beams output from the plurality of light emitting devices, and in this sense, the DOF 220 is different from the related art DOF (please refer to FIG. 3).

That is, the DOF of the present disclosure may diffract incident light such that a specific pattern is formed per light output from the light emitting device.

Meanwhile, the lighting device of the present disclosure may further include various types of refractive optical elements (e.g., a microlens array 240, a reflective lens, a projection lens 230, a collimator lens, a grating cell array (GCA), a mirror/prism array, a fly eye lens, a double refraction element, etc.) The lighting device of the present disclosure may include at least one of the refractive optical elements, and disposition positions of the refractive optical elements and refractive optical elements may vary.

For example, the microlens array 240 may be disposed between the plurality of light emitting devices 210 and the refractive optical element 220, and the projection lens 230 may be disposed in a direction in which light which has passed through the DOF travels such that light beams which have passed through the DOF may be incident thereto.

The various lenses may be used to refract light output from the plurality of light emitting devices such that the light may be incident to an optimized position of the DOF or change a FOV in which the light which has passed through the DOF travels.

For example, microlenses provided in the microlens array 240 may be disposed in positions corresponding to the number of the plurality of light emitting devices 210*a*, 210*b*, 210*c*, 210*d*, 210*e*.

The microlens array 240 may refract light output from the plurality of light emitting devices such that a plurality of light beams output from the plurality of light emitting devices are incident to be perpendicular to the DOF.

In another example, the microlens array 240 may refract light beams output from the plurality of light emitting devices such that all of the plurality of light beams output from the light emitting devices disposed in different positions are incident to the center of the DOF.

The projection lens 230 may be formed such that an FOV in which the plurality of first type of light and the plurality of second type of light which have passed through the DOF 220 travel is large. That is, when a plurality of light beams which have passed through the DOF 220 are incident, the projection lens 230 may refract the plurality of light beams and output to have an FOV larger than an FOV of the plurality of incident light beams.

The FOV in which the plurality of light beams passed through the projection lens 230 travel may be larger than a FOV in which a plurality of light beams not passed through the projection lens 230 travel.

The FOV may be determined when a product is released or may be determined according to a user design, and when the projection lens is formed to have a variable bending modulus, the FOV may be varied.

In the present disclosure, it is described that the DOE splits (duplicates) incident light. However, the present disclosure is not limited thereto and the lighting device of the present disclosure may also be applied to a case of using the aforementioned refractive optical element instead of the DOE or to a case of combining the DOE and the refractive optical element.

Descriptions of the DOE hereinafter may also be inferred and applied to a case of using the refractive optical element or to case of combining the DOE and the refractive optical element in the same/similar manner.

The DOE 220 of the present disclosure may duplicate light output from one light emitting device such that light output from one light emitting device has a specific pattern, rather than duplicating light by patterns formed by light output from a plurality of light emitting devices (that is, a pattern in which the plurality of light emitting devices are disposed).

For example, in (a) of FIG. 4, it is illustrated that light output from one light emitting device is split into five light beams through the DOE 220. Here, among the five light beams, a first type of light is one 410*a*, and second type of light may be the other remaining four light beams 420*a*, 422*a*, 424*a*, and 426*a*. Optical spots to which the five light beams are irradiated may form a specific pattern.

The DOE of the present disclosure may be provided to split one light output from one light emitting device to form a specific pattern, rather than duplicating a pattern in which a plurality of light emitting devices are disposed by patterns as illustrated in FIG. 3. In this manner, splitting, by the DOE 220, one light to form a specific pattern may be applied to light output from each of the plurality of light emitting devices.

In this case, to a plane 400 spaced apart from the lighting device 200 by a predetermined distance, light beams respectively output from the light emitting devices are irradiated to have a specific form, rather than that forms of the pattern in which the plurality of light emitting devices are disposed are duplicated and irradiated by patterns.

In this manner, the DOE of the present disclosure is different from the related art DOE of FIG. 3 in that, although the plurality of light emitting devices are provided, one light output from each of the light emitting devices is split into several light beams to form a specific pattern.

Hereinafter, as illustrated in (b) of FIG. 4, a case in which the DOE 220 diffracts (splits) incident one light beam into 3 by 3 form (predetermined pattern) 500 will be described as an example. Here, one light beam irradiated to the center of the 3 by 3 form may be a first type of light (e.g., zero-order light) and the other remaining eight light beams may be second type of light (e.g., first-order light).

The DOE 220 of the present disclosure may diffract (split) each of a plurality of light beams respectively output from the plurality of light emitting devices into the 3 by 3 form (predetermined pattern) and allow the same to transmit therethrough. That is, the DOE 220 of the present disclosure may split light output from each of the plurality of light emitting devices to form a predetermined pattern. Here, among the plurality of light beams forming the predetermined pattern, a first type of light (i.e., non-diffracted light) is one 510 and a second of light (i.e., refracted light) may be the other remaining eight light beams 520, 521, 522, 523, 524, 525, 526, and 527.

Thus, when light is irradiated from the lighting device having the plurality of light emitting devices through the DOE, a plurality of first type of light beams and second type of light beams may be irradiated. Also, the number of the plurality of first type of light beams may be equal to the number of the plurality of light emitting devices.

Figure 5:
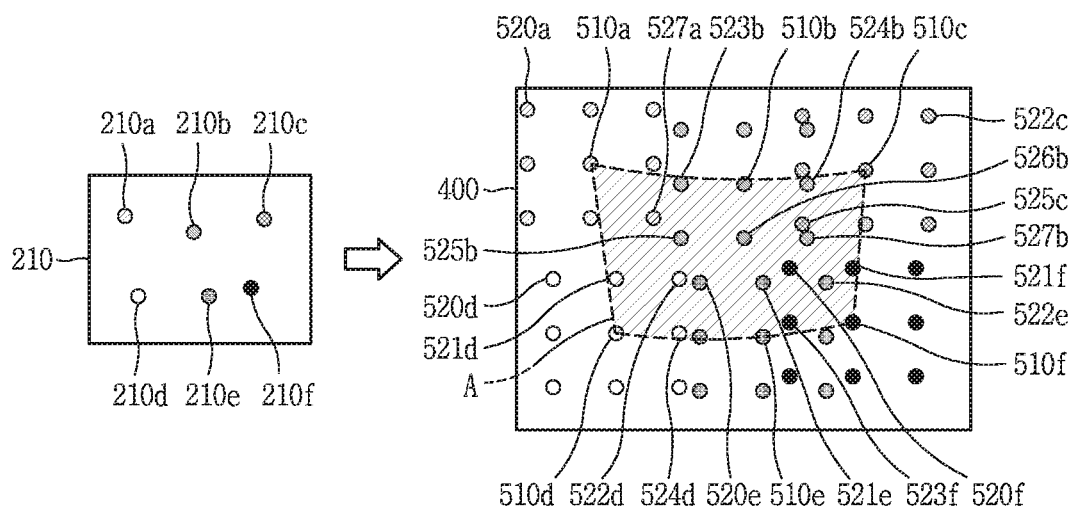
FIGS. 5, 6, 7, and 8 are conceptual views illustrating a lighting technology using a lighting device of the present disclosure.

For example, as illustrated in FIG. 5, when the plurality of light emitting devices is six devices and one light output from each light source is split into 9 light beams to form a predetermined pattern (3 by 3), the number of first type of light beams may be 6 and the number of second type of light beams may be 48 (6×8).

Referring to FIG. 5, the lighting device 200 of the present disclosure may include a plurality of light emitting devices 210a, 210b, 210c, 210d, 210e, and 210f. The DOE 220 included in the lighting device 200 may be positioned in a direction (e.g., an optical axis direction) in which light beams output from the plurality of light emitting devices travel.

The DOE 220 of the present disclosure may diffract (split or duplicate) incident light output from each of the plurality of light emitting devices to form a predetermined pattern (e.g., 3 by 3). That is, the DOE of the present disclosure may diffract (split) light by light sources such that one light beam output from each of the light emitting devices forms a predetermined pattern, rather than diffracting (splitting) a plurality of light beams, incident to correspond to the pattern in which the plurality of light emitting devices are disposed, to overlap by patterns.

In this case, light beams passing through the DOE 220 after being output from the plurality of light emitting devices may include a plurality of first type of light beams 510a, 510b, 510c, 510d, and 510e not diffracted by the DOE and a plurality of second type of light beams 520a, . . . , 527a, 520b, . . . , 527b, . . . , 520f, . . . , 527f diffracted by the DOE.

The DOE 220 of the present disclosure may diffract some of light beams output from the plurality of light emitting devices such that at least some of the plurality of second type of light beams are irradiated to the inside of a region formed by connecting the plurality of first type of light beams.

For example, as illustrated in FIG. 5, the DOE 220 of the present disclosure may diffract (split) one light output from each of the light emitting devices to have a predetermined pattern by light emitting devices.

Accordingly, as illustrated in FIG. 5, at least some (e.g., 527a, 523b, 524b, 525b, 526b, 527b, 525c, 521d, 522d, 524d, 520e, 521e, 522e, 520f, 521f, and 523f) of the plurality of second type of light beams may be irradiated to the inside of the region A formed by connecting the plurality of first type of light beams 510a, 510b, 510c, 510d, 510e, 510f.

Here, the other remaining light beams excluding the at least some of the plurality of second type of light beams may not be irradiated to the inside of the region formed by connecting the plurality of first type of light beams (that is, may be irradiated to a region outside the region A).

The region A formed by connecting the plurality of first type of light beams may be an internal region of a figure formed by connecting at least three optical spots among optical spots to which the plurality of first type of light beams are irradiated.

Preferably, the region A may be a region formed when optical spots selected to have the largest width, among optical spots to which the plurality of first type of light beams are irradiated, are connected, but the present disclosure is not limited thereto.

In detail, as illustrated in FIG. 5, when a plurality of first type of light beams and a plurality of second type of light beams are irradiated to a plane spaced apart from the lighting device 200 by a predetermined distance, at least some of the plurality of second type of light beams may be irradiated to (or included in) the inside of the region formed by connecting the plurality of first type of irradiated light beams.

In this manner, in the lighting device of the present disclosure, since the DOE diffracts (splits) one light output from each of the plurality of light emitting devices to have a predetermined pattern, when a plurality of light beams respectively output from the plurality of light emitting devices are incident to the DOE, at least some of the plurality of second type of light beams are irradiated to (included in) the inside of a region formed by connecting the plurality of first type of light beams.

Meanwhile, referring to FIG. 3, since the related art lighting device diffracts (splits) a plurality of light beams respectively output from the plurality of light emitting devices and irradiate the same such that the plurality of light beams do not overlap each other by patterns formed by the plurality of light emitting devices, the second type of light beams 320a, 320b, . . . , 320h cannot be irradiated to (included in) the region formed by connecting the first type of light beams 310.

Figure 6:
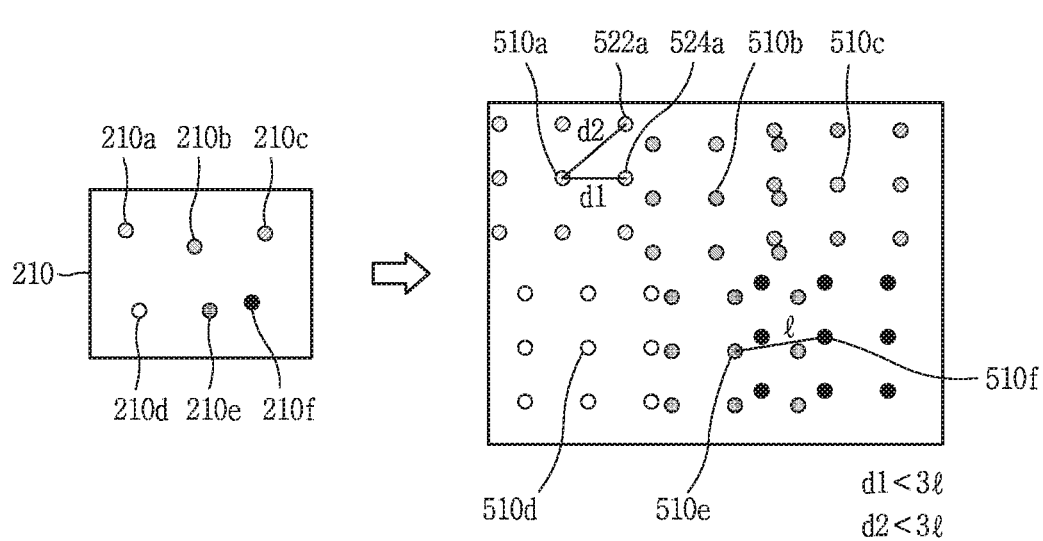

Meanwhile, referring to FIG. 6, the DOE 220 of the present disclosure may diffract (split or allow for transmission of) light beams output from the plurality of light emitting devices such that a distance between any one of the plurality of first type of light beams and a second type of light beam related to the any one light beam is three times a minimum distance between the plurality of first type of light beams.

For example, the plurality of first type of light beams and the plurality of second type of light beams transmitted through the DOE may be illustrated on a plane spaced apart from the lighting device 200 by a predetermined distance.

Here, distances d1 and d2 between any one light beam 510a among the plurality of first type of light beams and second type of light beams 522a and 524a related to the any one light beam irradiated to the plane may be three times a minimum distance (a distance between 510e and 510f in the case of FIG. 6) between the plurality of first type of light beams irradiated to the plane.

That is, in cases where a first type of light and a second type of light split from one light form a predetermined pattern, the first type of light beam 510a forming the predetermined pattern and the second type of light beams 520a, . . . , 520f forming the predetermined pattern may be understood as light beams related to each other.

Any one light beam (e.g., 510a) among the plurality of first type of light beams and the second type of light beams 520a, . . . , 520f related to the any one light beam may be light beams related to each other.

In other words, a distance between the any one light beam among the first type of light beams and the second type of light beam related to the any one light beam may refer to a distance between a non-diffracted light beam and a diffracted light beam when the any one light beam has passed through the DOE. The distance between the non-diffracted light beam and the diffracted light beam may have various values and may have any value. Preferably, however, the distances d1 and d2 between the non-diffracted light beam and the diffracted light beam may refer to a maximum distance d2.

To sum up, the DOE of the present disclosure may allow light beams output from the plurality of light emitting devices to transmit therethrough such that a (maximum) distance between the non-diffracted light beam 510a and the diffracted beam 522a or 524a ((maximum) distance between the first type of light beam and the second type of light beam) does not exceed three times the minimum distance between the plurality of non-diffracted light beams (the plurality of first type of light beams).

Also, the distance between the any one light beam and the second type of light beam related to the any one light beam (or the distance between the light beams split from one light or distance between the first type of light beam and the second type of light beam split from one light) may not exceed three times the minimum distance between the plurality of first type of light beams (i.e., d1<31 or d2<31).

In FIG. 6, it is illustrated that light is diffracted (split) such that the distance between any one light beam among the plurality of first type of light beams and the second type of light beam related to the any one light beam is smaller by one time than the minimum distance between the plurality of first type of light beams.

However, the DOE of the present disclosure may be provided to irradiate light such that the distance between the first type of light beam and the second type of light beam split from one light is within three times the minimum distance between the plurality of first type of light beams. The three times is a result derived from an experimental value obtaining optimized efficiency.

Meanwhile, referring to FIG. 3, in the related art lighting device, since light is split (duplicated) by patterns, light should be irradiated such that a distance between any one of the first type of light beams and a second type of light beam related to the any one light beam is three times or greater than a minimum distance between the first type of light beams. This is because the related art lighting device should split (duplicate) light such that light patterns do not overlap by the patterns in which the plurality of light emitting devices are disposed.

Figure 7:
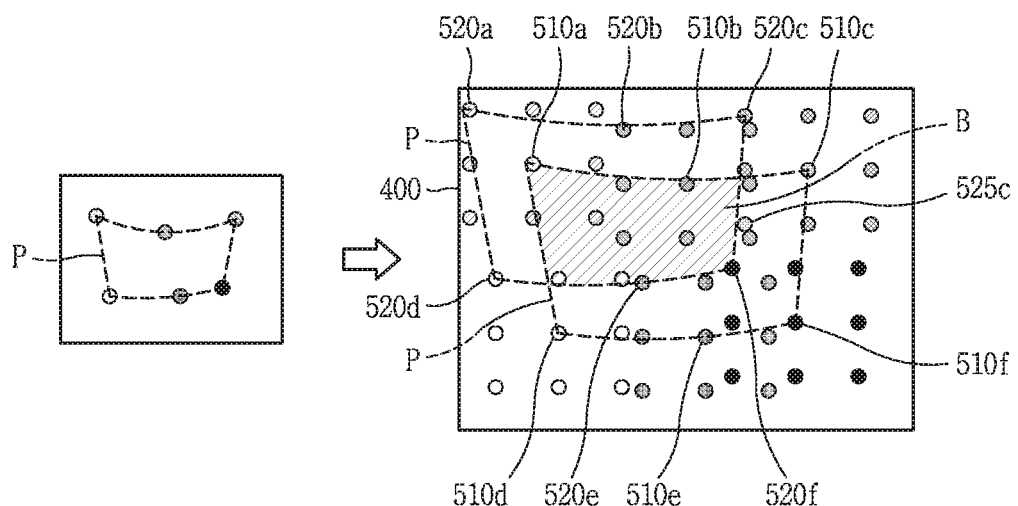

Meanwhile, referring to FIG. 7, the plurality of light emitting devices of the present disclosure may be disposed to form a specific pattern P.

Here, the DOE of the present disclosure diffracts one light irradiated from each light emitting device such that each light emitting device has a predetermined pattern (3 by 3). Here, since one light irradiated from each of the light emitting devices is diffracted to have the same predetermined pattern, a plurality of first type of light beams 510a, 510b, 510c, 510d, 510e, and 510f may form the specific pattern P corresponding to a disposition pattern of the light emitting devices, and the plurality of second type of light beams 520a, 520b, 520c, 520d, 520e, 520f may also form the specific pattern P.

That is, as illustrated in FIG. 7, the plurality of first type of light beams 510a, 510b, 510c, 510d, 510e, and 510f and the second type of light beams 520a, 520b, 520c, 520d, 520e, 520f diffracted (split or refracted) in the same direction as that of the first type of light beams, among the plurality of second type of light beams, may be irradiated to have (form) the specific pattern P corresponding to the disposition pattern P of the plurality of light emitting devices.

Here, a portion B of a first region occupied by the specific pattern P formed by the plurality of first type of light beams and a portion B of a second region occupied by the specific pattern P formed by the plurality of second type of light beams (specifically, light beams diffracted in the same direction among the plurality of second type of light beams) may overlap each other.

This is because the DOE of the present disclosure diffracts light from each of the plurality of light emitting devices to have a predetermined pattern (3 by 3) and allows light to transmit therethrough such that a distance between the first type of light beam (non-diffracted light beam) and the second type of light beam (diffracted light beam) split from one light is within three times a minimum distance between the plurality of first type of light beams (non-diffracted light beams).

In this manner, the region occupied by the pattern formed by the plurality of first type of light beams and the region occupied by the pattern formed by the plurality of second type of light beams (the pattern formed by the plurality of second type of light beams diffracted in the same direction) may partially overlap.

Meanwhile, referring to FIG. 3, since the related art lighting device split (duplicate) the plurality of light beams output from the plurality of light emitting devices not to overlap by patterns in which the plurality of light emitting devices are disposed, a region occupied by the pattern of the first type of light beam 310 and a region occupied by the pattern of the second type of light beam 320a do not overlap each other.

By the lighting technology described above, the lighting device of the present disclosure may increase the number (i.e., density of light) of light beams (optical spots) irradiated per unit area C.

Figure 8:
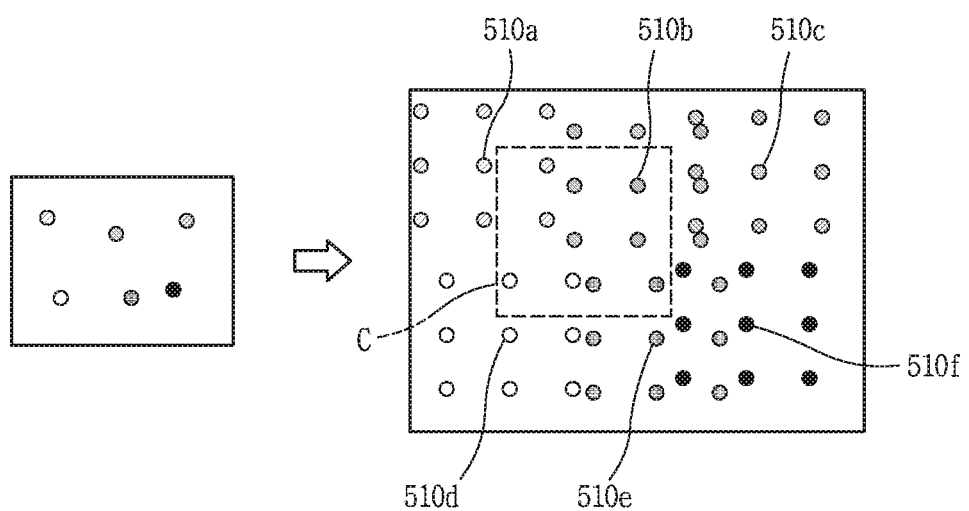

Referring to FIG. 8, as the number of the plurality of second type of light beams diffracted by the DOE 220 is increased, density of the first and second type of light beams may be increased. In other words, as the number of the plurality of second type of light beams which have passed through the DOE 220 is increased, density (i.e., the number of light beams (optical spots) irradiated per unit area C) of the first and second types of light beams may be increased.

Meanwhile, as illustrated in FIG. 3, in the related art lighting device (lighting technology), no matter how many the second type of light beams diffracted by the DOE is increased, the number (i.e., density of first and second types of light beams) of light beams (optical spots) per unit area C is uniform. This is because the related art lighting device duplicates a plurality of light beams output from the plurality of light emitting devices by patterns in which the plurality of light emitting devices are disposed.

According to the present disclosure, since light output from a light source can be diffracted (or split) into a plurality of light beams using the DOE, a lighting device capable of irradiating the number of optical spots larger than the number of light sources to a subject with a smaller number of light sources and a mobile terminal including the lighting device may be provided.

Accordingly, since a smaller number of light sources are required, cost may be reduced and a size of the terminal may be reduced.

Also, according to the present disclosure, since a light source is not duplicated (or split) by a pattern formed by a plurality of light sources but each of the light sources is duplicated (or split) by light sources, a new lighting device capable of increasing the number of optical spots per unit area, i.e., density of optical spots, may be provided.

Meanwhile, the lighting device related to the present disclosure may be formed to have various structures.

Hereinafter, various structures of a lighting device related to the present disclosure will be described in detail with reference to the accompanying drawings.

Figure 9:
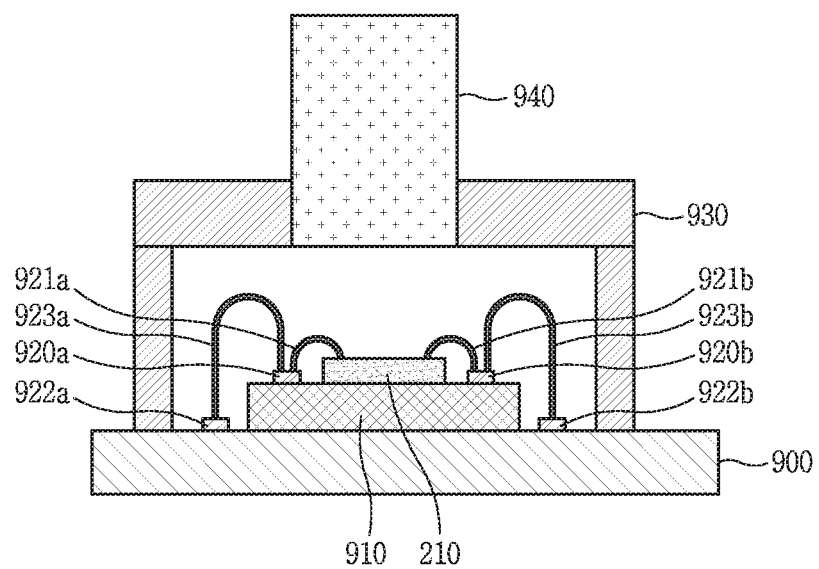
FIG. 9 is a conceptual view illustrating a structure of a related art lighting device.

FIG. 9 is a conceptual view illustrating a structure of a related art lighting device.

The related art lighting device includes a printed circuit board (PCB) 900, a submount 910 mounted on the PCB 900, and a die 210 mounted on the submount 910 and including a light emitting device.

The related art lighting device includes first pads (or first bonding pads) 920a and 920b disposed (mounted or provided) on the submount 910 and connected to the die 210 by first wire bondings 921a and 921b.

Also, the related art lighting device includes second pads (or second bonding pads 922a and 922b disposed (mounted or provided) on the submount 910 and connected to the first pads 920a and 920b by second wire bondings 923a and 923b.

Also, the related art lighting device may include a holder 930 formed to cover (or include) the submount 910, the die 210, the first pads 920a and 920b, the second pads 922a and 922b, the first wire bondings (or wire bonds) 921a and 921b connecting the die 210 and the first pads 920a and 290b, and the second wire bondings (or wire bonds) 923a and 923b connecting the first pads 920a and 920b and the second pads 922a and 922b.

As illustrated in FIG. 9, the holder 930 is disposed on the PDB 900 and an internal space of the holder 930 may include the submount, the die, the first pads, the second pads, and the first and second wire bondings.

In the related art lighting device, the die 210 is electrically connected to the PD 900 through the first pads 920a and 920b and the second pads 922a and 922b.

That is, the die 210 may be electrically connected to the PCB 900 through the first wire bondings 921a and 921b and the second wire bondings 923a and 923b.

Meanwhile, a roof-height of the second wire bondings 923a and 923b connecting the first pads 920a and 920b and the second pads 922a and 922b is higher than a roof-height of the first wire bondings 921a and 921b connecting the die 210 and the first pads 920a and 920b.

For example, the roof-height of the first wire bondings 921a and 921b connecting the die 210 and the first pads 920a and 920b may be proportional to a height of the die 210. In general, the die 210 has low (small) height value, and thus, the roof-height of the wire bondings 921a and 921b may also be low (small).

Meanwhile, the roof-height of the second wire bondings 923a and 923b connecting the first pads 920a and 920b and the second pads 922a and 922b may be proportional to a height of the submount 910. Also, a height of the second wire bondings 923a and 923b may be proportional to a distance between the first pads 920a and 920b and the second pads 922a and 922b.

In general, the height of the submount 910 may be higher (greater) than a height of the die 210. For example, when the die 210 has a height of about 0.1 mm, the submount 910 may have a height of about 0.5 mm.

If the height of the submount 910 is 0.5 mm or greater, the roof-height of the second wire bondings 923a and 923b connecting the first pads 920a and 920b and the second pads 922a and 922b may have a height equal to or greater than 0.5 mm.

Also, the roof-height of the second wire bondings 923a and 923b may be about 0.25 mm from the submount 910.

Here, the roof-height of the second wire bondings 923a and 923b may be about 0.75 mm from the PCB 900.

Accordingly, as illustrated in FIG. 9, the roof-height of the second wire bondings 923a and 923b connecting the first pads 920a and 920b and the second pads 922a and 922b is higher than the roof-height of the first wire bondings 921a and 921b connecting the die 210 and the first pads 920a and 920b.

In addition, the second pads 922a and 922b is disposed on the PCB 920 and spaced apart from a side surface of the submount 910.

Also, as illustrated in FIG. 9, the holder 930 mounted on the PCB 900 included in the related art lighting device may include even the second pads 922a and 922b.

Accordingly, a volume of the internal space of the holder 930 is increased as the roof-height of the second wire bondings 923a and 923b connecting the first pads 920a and 920b and the second pads 922a and 922b is higher, as a size of the second pads 922a and 922b is increased, or as a distance between the second pads 922a and 922b on the PCB 900 and the side surface of the submount 910 is increased.

As a size of the internal space of the holder 930 is increased, a volume of the lighting device is also increased.

Accordingly, the related art lighting device requires a large volume due to the roof-height of the second wire bondings 923a and 923b connecting the first pads 920a and 920b and the second pads 922a and 922b and the second pads 922a and 922b disposed on the PCB 900.

Meanwhile, in order to reduce a size of the lighting device, the aforementioned problem should be solved. A lighting device of the present disclosure may provide a structure formed to significantly reduce a volume, compared with the related art lighting device.

Hereinafter, the lighting device of the present disclosure formed to minimize a volume will be described with reference to the accompanying drawings.

Figure 10:
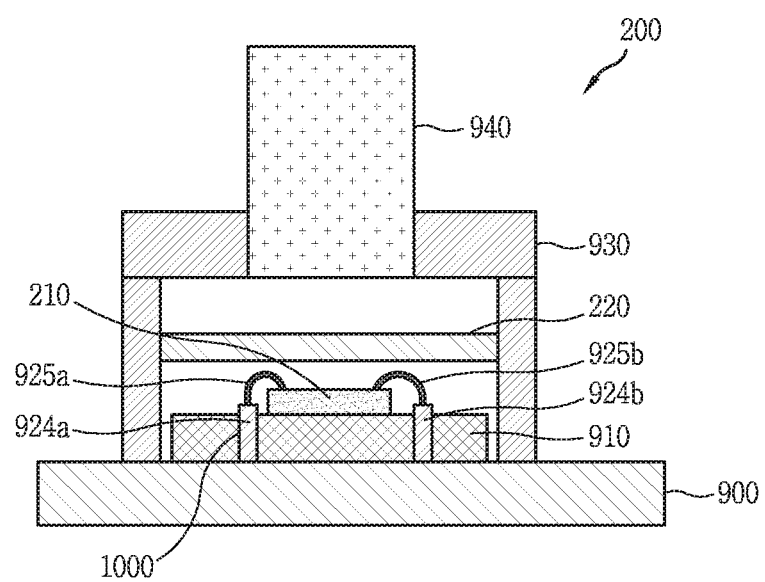
FIG. 10 is a cross-sectional view illustrating a structure of a lighting device according to a first embodiment of the present disclosure.

FIG. 10 is a cross-sectional view illustrating a structure of a lighting device according to a first embodiment of the present disclosure.

A lighting device 200 related to the present disclosure may include a PCB 900.

The PCB 900 may include a printed wiring board (PWB).

The PCB 900 may have a circuit printed (disposed or mounted) thereon to transmit an electrical signal. On the PCB 900, at least one of the components described above with reference to FIG. 1 may be disposed to transmit and receive an electrical signal.

The lighting device 200 related to the present disclosure may include a submount 910 mounted (disposed or coupled) on the PCB 900.

Also, the lighting device 200 related to the present disclosure may include a die 210 mounted (disposed or coupled) on the submount 910 and including a plurality of light emitting devices.

The submount 910 may serve to dissipate heat. In detail, the submount 910 may be formed to dissipate heat generated in the die 210 disposed on the submount 910 (specifically, heat generated due to light emission of a plurality of light emitting devices provided on the die 210. For example, the submount 910 may be formed of a material of heat dissipation and may also be termed a heat sink.

The die 210 may have the plurality of light emitting devices 210a, 210b, . . . described above with reference to FIGS. 3 to 8. For example, each of the plurality of light emitting devices may be a laser diode and may be a VCSEL.

Also, the lighting device 200 related to the present disclosure may include a pad 924 inserted into a hole 1000 formed in the submount 910 such that the die 210 and the PCB 900 are electrically connected through the submount, connected to the die 210 by a wire bonding 925, and electrically connected to the PCB 900.

That is, referring to FIG. 10, the lighting device 200 related to the present disclosure may include the PCB 900, the submount 910 mounted on the PCB 900, the die 210 mounted on the submount 910 and having a plurality of light emitting devices, and the pads 924 (924a and 924b) inserted into the hole 1000 formed in the submount 910 such that the die 210 and the PCB 900 are electrically connected through the submount 910, connected to the die 210 and the wire bondings 925 (925a and 925b), and electrically connected to the PCB 900.

In FIG. 10, two wire bondings 925a and 925b, two holes 1000, and two pads 924a and 924b are illustrated, but the present disclosure is not limited thereto. That is, in FIGS. 10 to 14B, the lighting device of the present disclosure is illustrated as a cross-sectional view based on a central axis, and thus, these components are illustrated by twos.

The wire bondings 925a and 925b, the holes 1000, and the pads 924a and 924b may be provided in plurality, and for example, the number of the holes 1000 and the pads 924a and 924b may correspond to the number of wire bondings in the die 210.

The submount 910 may have a plurality of holes 1000. The holes 1000 formed in the submount 910 may penetrate through the submount. For example, the holes 1000 may include a via hole.

The pad 924 may be inserted (mounted, disposed) in the hole 1000. The pad 924 may be formed of a conductive material. The pad 924 may be termed a bonding pad.

As illustrated in FIG. 10, the pad 924 may be inserted into the hole 1000 formed in the submount 910 and may be connected to the die 210 by the wire bondings 925a and 925b.

Also, as illustrated in FIG. 10, the pad 924 may be inserted into the hole 1000 formed in the submount 910 and electrically connected to the PCB 900.

Through the pad 924 inserted into the hole 1000 formed in the submount 910, the die 210 and the PCB 900 may be electrically connected through the submount 910.

In detail, the plurality of light emitting devices provided in the die 210 and the PCB 900 (circuit provided on the PCB 900) may be electrically connected through the submount 910 via the pads 924a and 924b inserted into the submount 910.

Also, an area of the submount 910 may be larger than that of the die 210. This is for the wire bonding 924 between the die 210 and the pad 924 inserted into the hole of the submount 910.

Through this configuration, the lighting device of the present disclosure may omit (not include) the second pads 922a and 922b and the second wire bondings 923a and 923b. Thus, in the present disclosure, a volume for accommodating the second pads 922a and 922b and the second wire bondings 923a and 923b may be reduced.

Meanwhile, as illustrated in FIG. 10, the lighting device related to the present disclosure may include a holder 930 provided on the PCB 900 and formed to cover (include or accommodate) the die 210 and the submount 910.

The holder 930 may have an internal space between the die 210 and the holder 930. The internal space may be in a vacuum state without air but the present disclosure is not limited thereto.

The holder 930 may be formed to cover (include accommodate) the die 210, the submount 910, the pad 924 inserted into the hole 1000 penetrating through the submount 910, and the wire bonding 925 connecting the die 210 and the pad 924.

The holder 930 may serve as a case in that it covers the components 210, 910, 924, and 925. Also, the holder 930 may be formed as a case, or, as illustrated in FIG. 10, the holder 930 may be configured by coupling a plurality of cases.

Meanwhile, an internal space may be formed between the holder 930 and the die 210.

The lighting device 200 of the present disclosure may include a diffractive optical element (DOE) disposed between the holder 930 and the die 210 and disposed (fixed or mounted) by the holder 930. The DOE 220 may be positioned in an optical axis direction of the plurality of light emitting devices such that light output from the plurality of light emitting devices of the die 210 may pass therethrough.

The DOE 220 may be the DOE described above with reference to FIGS. 3 to 8. The DOE 220 may be selectively provided according to a user design or may be omitted.

Also, the holder 930 of the lighting device related to the present disclosure may have a lens 940 allowing light output from the plurality of light emitting devices provided in the die 210 to transmit therethrough. That is, the lens 940 is mounted (disposed) on the holder 930 and may be positioned in an optical axis direction of the plurality of light emitting devices such that light output from the plurality of light emitting devices (or light which has passed through the DOE 220) may transmit therethrough.

Light output from the plurality of light emitting devices provided in the die 210 may be diffracted (split or duplicated) by the DOE, and the diffracted (split or duplicated) light may be incident to the lens 940, transmits through the lens 940, and is output to an external space. The lens 940 may be the lens 230 described above.

Through this configuration, in the present disclosure, through the pad 942 inserted into the hole 1000 formed in the submount 910, wire-bonded 924 to the die 210, and electrically connected to the PCB 900, the die 210 and the PCB 900 may be electrically connected through the submount 910, whereby a volume of the lighting device may be significantly reduced.

That is, since the present disclosure does not include the second pads 922a and 922b and the second wire bondings 923a and 923b provided in the related art lighting device, a volume of the holder 930 covering the second pads 922a and 922b and the second wire bondings 923a and 923b may be reduced, and accordingly, an overall volume of the lighting device may also be significantly reduced.

Meanwhile, the lighting device related to the present disclosure may include various embodiments capable of dissipating heat through an optimized structure, as well as the structure minimizing the volume. Hereinafter, a structure related to heat dissipation of the lighting device related to the present disclosure will be described in detail with reference to the accompanying drawings.

Figure 11A:
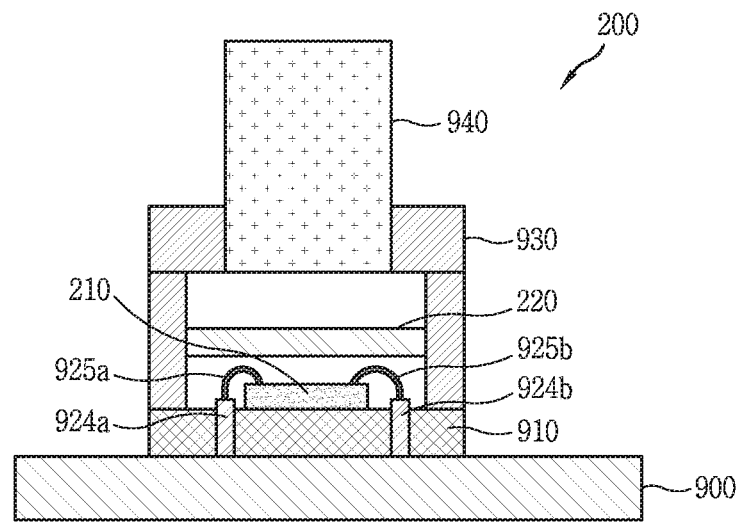
FIGS. 11A and 11B are cross-sectional views illustrating a structure of a lighting device according to a second embodiment of the present disclosure.
Figure 11B:
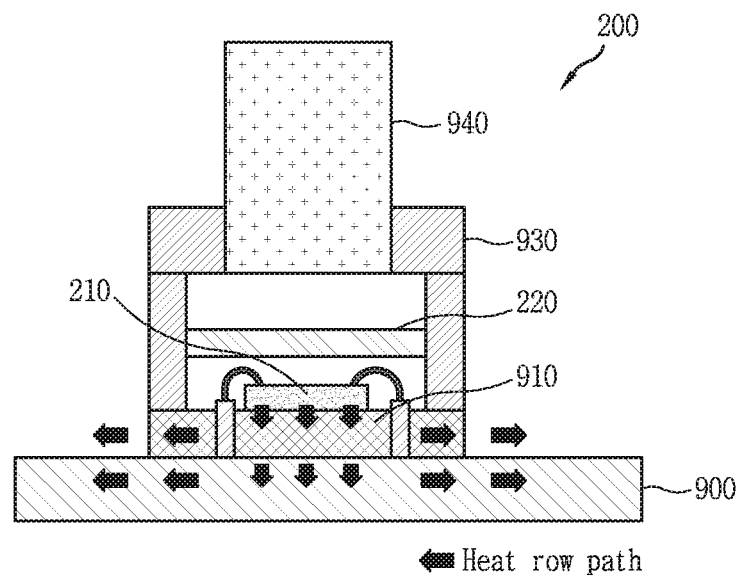

FIGS. 11A and 11B are cross-sectional views illustrating a structure of a lighting device according to a second embodiment of the present disclosure.

A lighting device 200 according to the second embodiment of the present disclosure may include the PCB 900, the submount 910 mounted on the PCB 900, the die 210 mounted on the submount 910 and having a plurality of light emitting devices, and the pads 924 (924a and 924b) inserted into the hole 1000 formed in the submount 910 such that the die 210 and the PCB 900 are electrically connected through the submount 910, connected to the die 210 and the wire bondings 925 (925a and 925b), and electrically connected to the PCB 900.

Descriptions of the PCB 900, the submount 910, the die 210, and the pad 924 will be replaced by the above descriptions with reference to FIG. 10.

As illustrated in FIG. 11A, the lighting device 200 according to the second embodiment of the present disclosure may include a holder 930 mounted on the submount 910, formed to cover (include or accommodate) the die 210, and having an internal space.

That is, the holder 930 provided in the lighting device 200 according to the second embodiment may be mounted (disposed) on the submount 910, unlike the holder 930 provided in the lighting device 200 according to the first embodiment.

That is, the holder 930 according to the second embodiment may be mounted on the submount 910, rather than on the PCB 900, to cover the die 210 and the pads 924 (924a and 924b) inserted into the holes formed in the submount 910.

Like the holder 930 of the first embodiment, the DOE 220 may be disposed in an internal space of the holder 930, and a lens 940 may be provided therein.

Descriptions of the DOE 220 and the lens 940 will be replaced with the descriptions above with reference to FIG. 10.

As illustrated in FIG. 11B, in the lighting device 200 according to the second embodiment, since the holder 930 is mounted on the submount 910, heat generated in the die 210 (that is, heat generated by a plurality of light emitting devices provided in the die 210) may be dissipated (transmitted) through the side surface of the submount 910 and the PCB 900.

That is, as illustrated in FIG. 11B, heat generated in the die 210 is transmitted to the submount 910 and heat transmitted to the submount 910 may be transmitted to the PCB 900.

The submount 910 of the lighting device 200 according to the second embodiment may have an area larger than that of the submount 910 according to the first embodiment. This is to dispose the holder 930 on the submount 910.

Also, according to the second embodiment, since the holder 930 is disposed on the submount 910, a side surface of the submount 910 is exposed to the outside.

Accordingly, heat generated in the die 210 may be dissipated through the side surface of the submount 910 and the PCB 900 as illustrated in FIG. 11B.

Also, heat generated in the die 210 may be rapidly transmitted to the PCB 900 due to the presence of the submount 910 having an area (or a width) larger than that of the first embodiment.

Thus, the lighting device 200 according to the second embodiment may rapidly and effectively dissipate heat generated in the die 210.

Figure 12A:
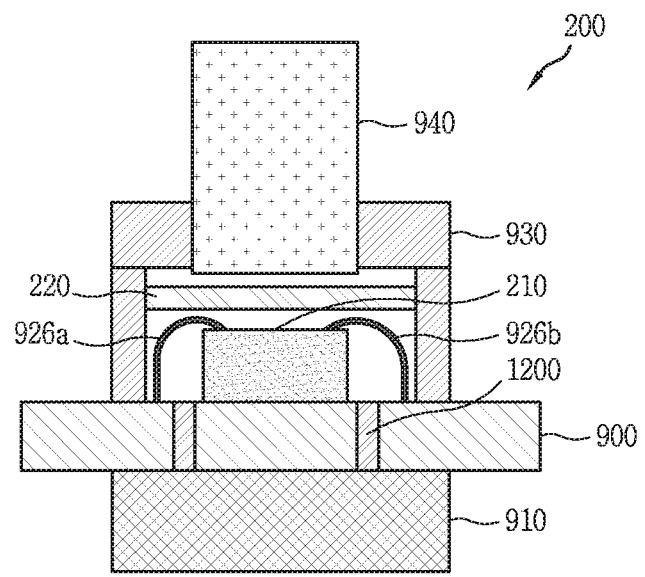
FIGS. 12A and 12B are cross-sectional views illustrating a structure of a lighting device according to a third embodiment of the present disclosure.
Figure 12B:
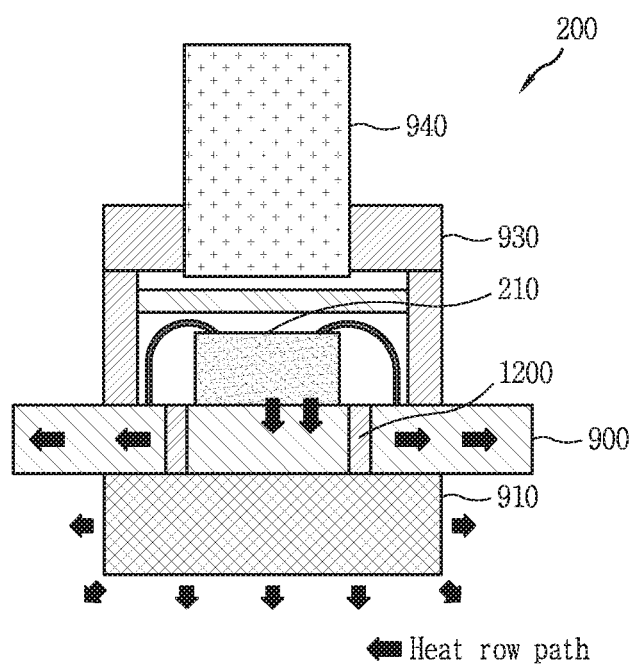

FIGS. 12A and 12B are cross-sectional views illustrating a structure of a lighting device according to a third embodiment of the present disclosure.

Referring to FIG. 12A, a lighting device 200 according to the third embodiment may include the PCB 900 and the die 210 disposed (mounted) on one surface of the PCB 900. That is, unlike the first embodiment, the die 210 may be immediately disposed (mounted) on one surface of the PCB 900.

Meanwhile, the lighting device 200 according to the third embodiment may include a submount 910 disposed (mounted) on the other surface opposing one surface of the PCB 900.

That is, unlike the first embodiment, the submount 910 may be mounted (disposed) on the other surface opposing the one surface on which the die 210 is disposed in the PCB 900.

Also, the lighting device 200 according to the third embodiment may include a heat dissipation member 1200 inserted into a hole formed in the PCB 900 and connected to one surface of the PCB 900 and the submount 910 mounted on the other surface of the PCB 900, so that heat generated in the die 210 (that is, heat generated by a plurality of light emitting devices provided in the die 210) may be transmitted to the submount 910 through the PCB 900.

A thermally conductive material (or a heat dissipation member) for transmitting heat generated in the die 210 to the heat dissipation member 1200 may be additionally coated on one surface of the PCB 900. Here, the die 210 may be mounted on one surface of the PCB 900 so as to be in contact with the thermally conductive material.

Also, in cases where the thermally conductive material is coated on one surface of the PCB 900, the heat dissipation member 1200 may be inserted into the hole formed in the PCB 900 so as to be connected to the thermally conductive material and the submount 910.

The PCB 900 may have the hole formed to penetrate through the PCB 900 to increase heat conductivity between the die 210 disposed on one surface thereof and the submount 910 disposed on the other surface thereof.

The hole may include the heat dissipation member 120 to transmit heat generated in the die 210 to the submount 910.

The heat dissipation member 1200 may be inserted into the hole formed in the PCB 900 and connected to the one surface and the other surface of the PCB 900 (or penetrate through the PCB 900).

The heat dissipation member 1200 may be formed of a material having high heat conductivity. For example, the heat dissipation member 1200 may be formed of a metal or a plastic material with high heat conductivity.

According to the third embodiment, the die 210 and the PCB 900 may be directly connected by wire bondings 926a and 926b. That is, according to the third embodiment, the submount 910 is not disposed between the die 210 and the PCB 900, and the PCB 900 may be disposed between the die 210 and the submount 910.

The lighting device 200 according to the third embodiment may have a holder 930 disposed on one surface of the PCB (i.e., one surface of the PCB 900 on which the die 210 is disposed), formed to cover (include or accommodate) the die 210, and having an internal space.

The holder 930 may be formed such that the hole formed in the PCB 900 is positioned within the internal space.

Like the holder 930 of the first embodiment, a DOE 220 may be disposed in the internal space of the holder 930, and a lens 940 may be provided in the holder 930.

Descriptions of the DOE 220 and the lens 940 will be replaced with the descriptions above with reference to FIG. 10.

Referring to FIG. 12B, in the lighting device 200 according to the third embodiment, since the submount 910 is disposed on the other surface of the PCB 900 opposing one surface thereof on which the die 210 is disposed and the holder 930 is disposed on one surface of the PCB 900 on which the die 210 is disposed, the submount 910 is exposed to the outside.

Also, according to the third embodiment, the PCB 900 includes a hole penetrating through one surface and the other surface thereof, and the heat dissipation member 1200 is inserted into the hole to transmit heat generated in the die 210 and heat of the internal space of the holder 930 to the PCB 900 and the submount 910 to dissipate heat.

Here, since the submount 910 is present outside, rather than inside of the holder 930, the present disclosure may maximize heat dissipation efficiency through the outwardly exposed submount 910.

Figure 13A:
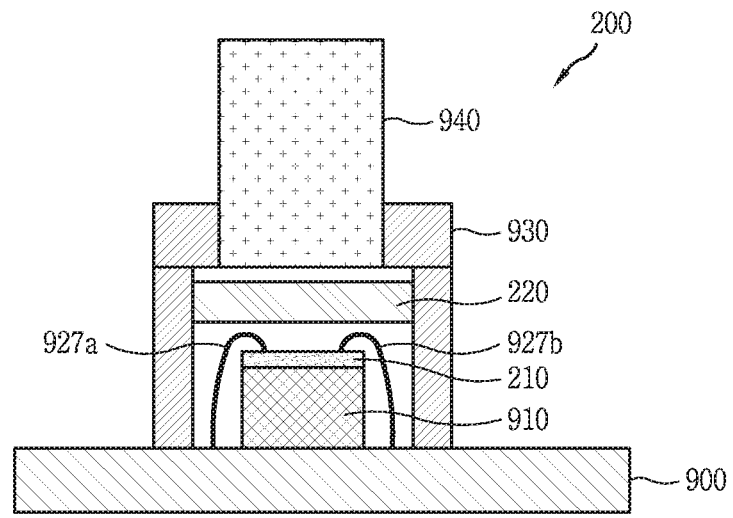
FIGS. 13A and 13B are cross-sectional views illustrating a structure of a lighting device according to a fourth embodiment of the present disclosure.
Figure 13B:
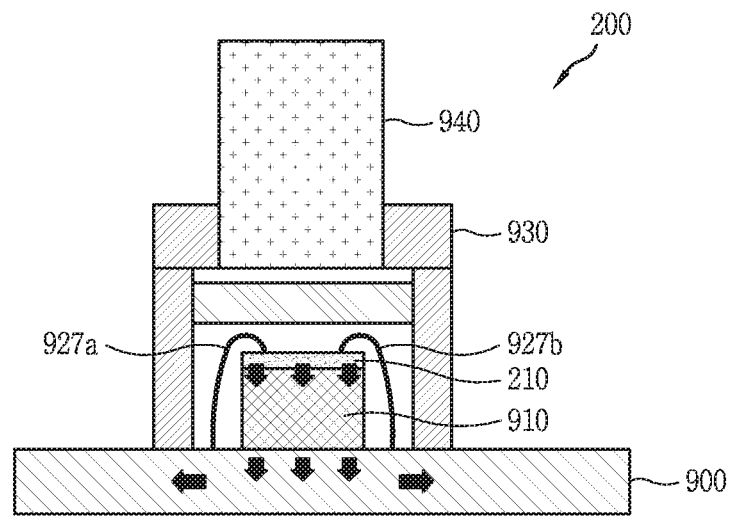

FIGS. 13A and 13B are cross-sectional views illustrating a structure of a lighting device according to a fourth embodiment of the present disclosure.

Referring to FIG. 13A, a lighting device 200 according to the fourth embodiment of the present disclosure may include a PCB 900, a submount 910 mounted (disposed) on the PCB 900, and a die 210 mounted (disposed) on the submount 910 and having a plurality of light emitting devices.

Here, as illustrated in FIG. 13A, the submount 910 of the lighting device 200 according to the fourth embodiment may be formed such that an area thereof in contact with the die 210 and an area thereof in contact with the PCB 900 are equal.

An area of the submount 910 according to the first embodiment is larger than an area of the die 210 in order to allow the pad 924 to be inserted therein.

In contrast, the submount 910 according to the fourth embodiment may be formed to have an area equal to that of the die 210.

Also, in order to increase efficiency of dissipation of heat generated in the die 210, the submount 910 according to the fourth embodiment may be formed to have a height higher than the submount 910 of the first embodiment such that an area thereof directly in contact with an air layer (or a vacuum layer) is increased.

That is, the submount 910 according to the fourth embodiment may be formed to have a height higher than that of the submount 910 of the first embodiment, in spite having an area smaller than that of the submount 910 of the first embodiment.

Meanwhile, the lighting device 200 according to the fourth embodiment does not have a hole in the submount 910 or a pad inserted into the hole. This is because the area of the submount 910 is equal to the area of the die 210.

Accordingly, the die 210 of the lighting device according to the fourth embodiment may directly be electrically connected to the PCB 900 by wire bondings 927 (927a and 927b).

That is, as in the first embodiment, the holder 930 according to the fourth embodiment may be mounted on the PCB 900 to cover (include or accommodate) the die 210, the submount 910, and the wire bondings 927 connecting the die 210 and the PCB 900. The holder 930 may have an internal space.

Like the holder 930 of the first embodiment, a DOE 220 may be disposed in the internal space of the holder 930 and a lens 940 may be provided therein.

Descriptions of the DOE 220 and the lens 940 will be replaced with descriptions above with reference to FIG. 10.

Referring to FIG. 13B, in the lighting device 200 according to the fourth embodiment, heat generated in the die 210 is transmitted to the submount 910 having a height higher than that of the submount 910 of the first embodiment and transmitted from the submount 910 to the PCB 900. The submount 910 and the PCB 900 may dissipate heat transmitted from the die 210.

Figure 14A:
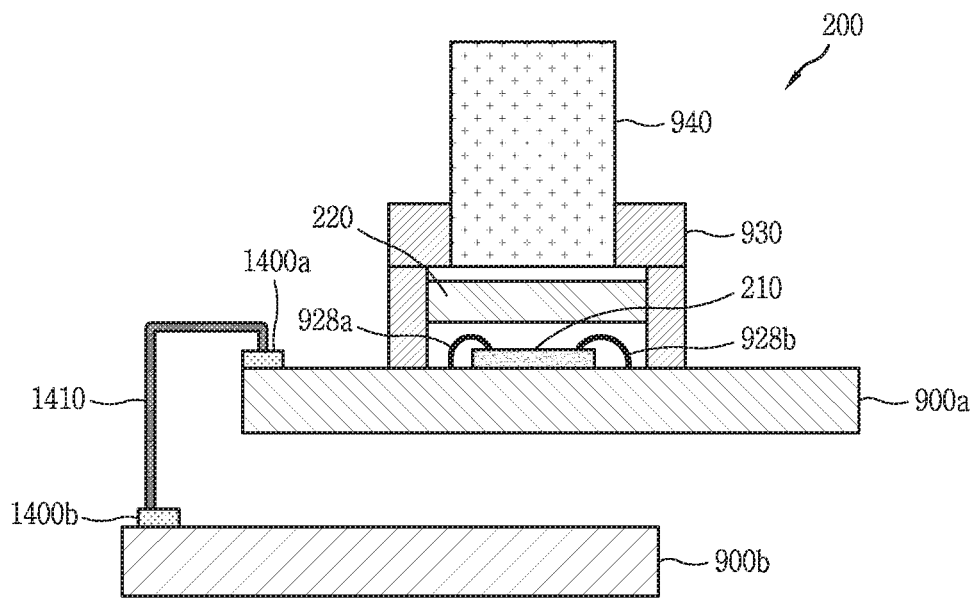
FIGS. 14A and 14B are cross-sectional views illustrating a structure of a lighting device according to a fifth embodiment of the present disclosure.
Figure 14B:
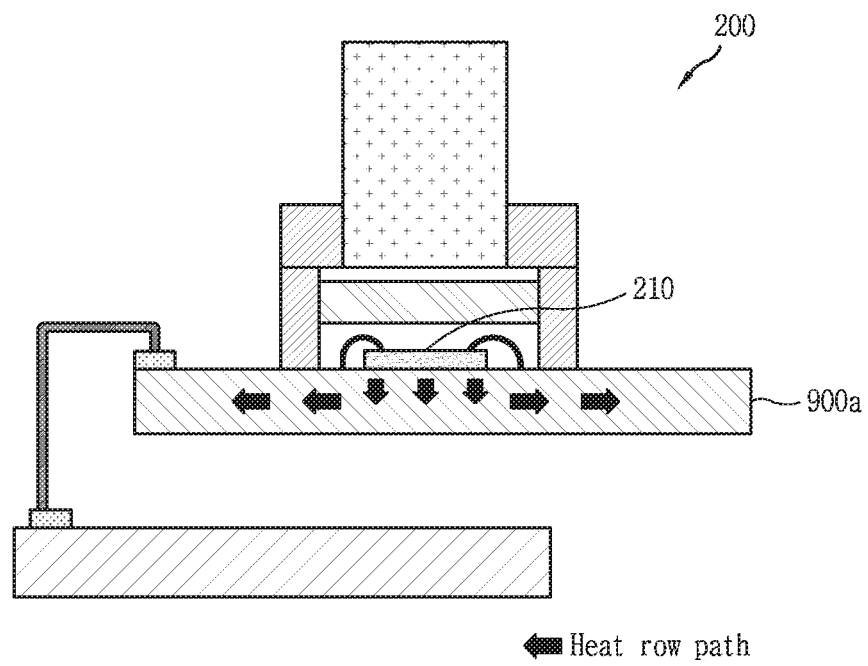

FIGS. 14A and 14B are cross-sectional views illustrating a structure of a lighting device according to a fifth embodiment of the present disclosure.

Referring to FIG. 14A, a lighting device 200 according to the fifth embodiment of the present disclosure may include a first PCB 900a and a die 210 disposed (mounted) on the first PCB 900a. That is, unlike the first embodiment, the die 210 may be directly disposed (mounted) on the first PCB 900.

Meanwhile, the first PCB 900a may be formed as a metal member. Thus, the first PCB 900a may have heat dissipation efficiency better than that of the first embodiment.

That is, the die 210 may have a plurality of light emitting devices and maybe disposed on the first PCB 900a formed as a metal member.

Also, the die 210 and the first PCB 900a may be connected by wire bondings 928 (928a and 928b).

Meanwhile, as illustrated in FIG. 14A, the lighting device 200 according to the fifth embodiment of the present disclosure may include a second PCB 900b disposed to be spaced apart from the first PCB 900a by a predetermined distance and electrically connected to the first PCB 900a through a cable 1410.

Here, the components described above with reference to FIG. 1 may be provided in at least one of the first PCB 900a and the second PCB 900b.

The first PCB 900a may be formed as a metal member to have a heat dissipation function better than that of the second PCB 900b.

Also, as illustrated in FIG. 14A, the lighting device 200 according to the fifth embodiment may include a holder 930 disposed on the first PCB 900a, formed to cover (include or accommodate) the die 210 and the wire bonding 928 electrically connecting the die 210 and the first PCB 900a, and having an internal space.

Like the holder 930 of the first embodiment, a DOE 220 may be disposed in the internal space of the holder 930, and a lens 940 may be provided therein.

Descriptions of the DOE 220 and the lens 940 will be replaced with the descriptions above with reference to FIG. 10.

The first PCB 900a and the second PCB 900B may have connectors 1400a and 1400b for connecting the cable 1410, respectively. That is, the first connector 1400a is provided in the first PCB 900a, and the second connector 1400b may be provided in the second PCB 900b. Here, the first connector 1400a may be provided (mounted or disposed) outside of the holder 930, rather than inside of the holder 930.

The cable 1410 may be connected to the first connector 1400a and the second connector 1400b to electrically connect the first PCB 900a and the second PCB 900b. The cable 1410 may be replaced by a wire bonding.

The die 210 (a plurality of light emitting devices provided in the die 210) may be electrically connected to the first PCB 900a through a wire bonding 928.

Also, the die 210 may be electrically connected to the second PCB 900b by way of the first PCB 900a through the cable 1410 connecting the first PCB 900a and the second PCB 900B.

Referring to FIG. 14B, according to the fifth embodiment, since the die 210 having a plurality of light emitting devices is directly mounted (disposed) on the first PCB 900a, the first PCB 900a formed as a metal member may directly transmit heat generated in the die 210.

Since the first PCB 900a has a large area in contact with the outside of the holder 930, heat generated in the die 210 may be effectively dissipated.

The first PCB 900a may be formed to transmit an electrical signal and serve as a submount (i.e., to perform a heat dissipation function).

Through this configuration, the present disclosure may provide an optimized structure of the lighting device capable of effectively dissipating heat generated in the die 210.

Figure 15A:
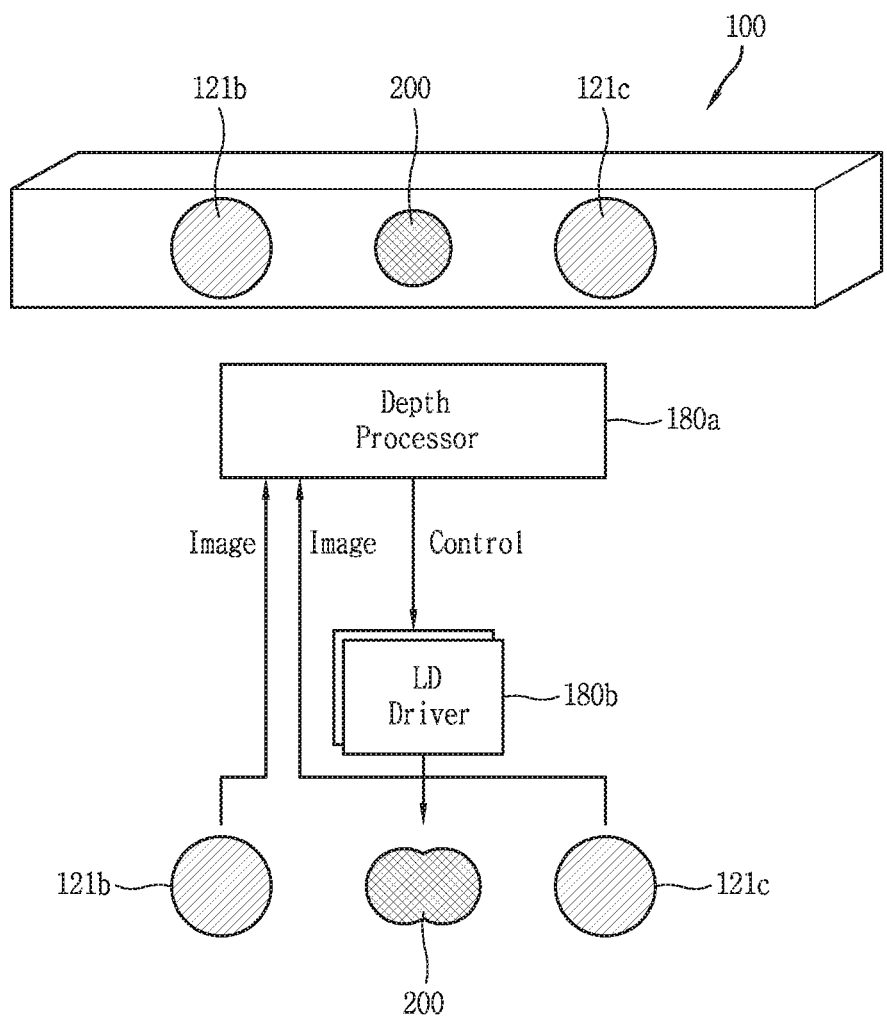
FIGS. 15A and 15B are conceptual views illustrating a configuration to control a lighting device according to an embodiment of the present disclosure.
Figure 15B:
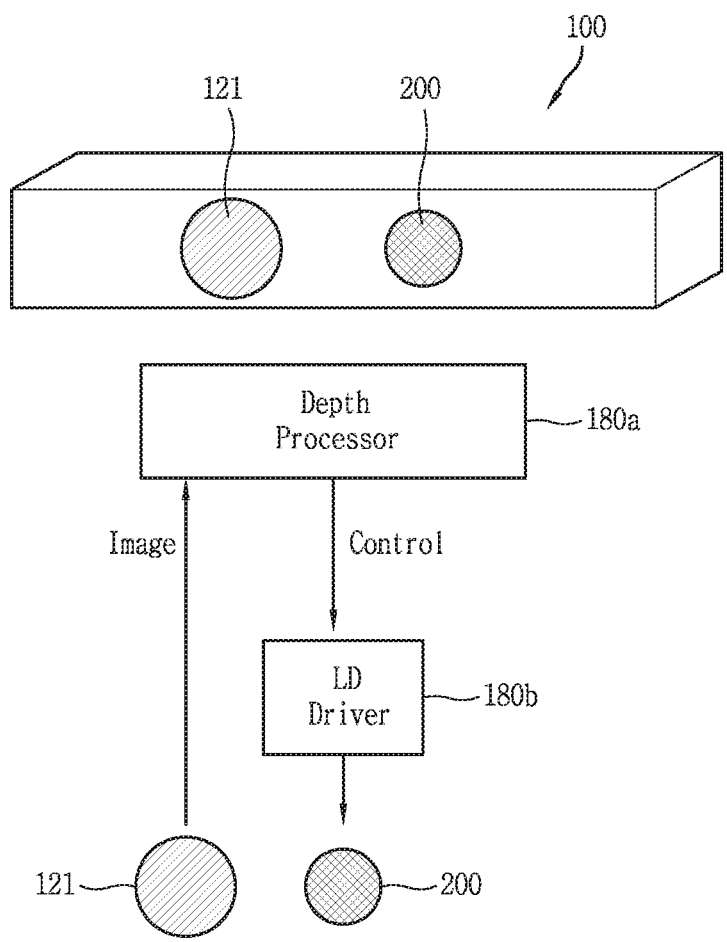

FIGS. 15A and 15B are conceptual views illustrating a configuration to control a lighting device according to an embodiment of the present disclosure.

Referring to FIG. 15A, a mobile terminal 100 related to the present disclosure may include at least one camera 121b and 121c and a lighting device 200.

A controller 180 of the mobile terminal 100 related to the present disclosure may extract depth information of an image received through the at least one camera 121b and 121c using the lighting device 200.

Here, as illustrated in FIG. 15A, in cases where the plurality of cameras 121b and 121c are provided, the mobile terminal 100 of the present disclosure may extract depth information of an image by using any one of a stereo vision scheme, a structure light scheme, and a ToF scheme or by combining at least two thereof.

Meanwhile, as illustrated in FIG. 15B, in cases where a single camera 121 is provided, the mobile terminal 100 of the present disclosure may extract depth information by using any one of the structure light scheme and the ToF scheme or by combining the two schemes.

As illustrated in FIGS. 15A and 15B, the mobile terminal 100 related to the present disclosure may include a depth processor 180a and an LD driver 180b. The depth processor 180a and the LD driver 180b may be included in the controller 180 or may be separately configured. For example, the depth processor 180a and the LD driver 180b may be independently provided in the lighting device 200.

The depth processor 180a may perform the operation (function or control) of the controller 180 described above in this disclosure in the same or similar manner.

For example, the depth processor 180a may control the LD driver 180b to cause the lighting device to emit light. In detail, the LD driver 180b may control a plurality of light emitting devices provided in the lighting device 200 under the control of the depth processor 180a.

The LD driver 180b may cause the plurality of light emitting devices provided in the lighting device 200 to simultaneously emit light on the basis of a control command received by the depth processor 180a or cause the plurality of light emitting devices to sequentially emit light within a preset period of time according to preset order.

Here, peak power required when the plurality of light emitting devices sequentially emit light within a preset period of time according to preset order may be smaller than peak power required when the plurality of light emitting devices simultaneously emit light.

Letting the plurality of light emitting devices sequentially emit light within the preset period of time according to preset order may be understood as performing a process of maintaining the other remaining light emitting devices in an OFF state while a first light emitting device among the plurality of light emitting device is turned on and off during a predetermined period of time, and turning on and off a second light emitting device different from the first light emitting device for a predetermined period of time when the first light emitting device is turned off, within a preset period of time. That is, turn-on times of the first light emitting device and the second light emitting device do not overlap or may over for a predetermined period of time or less. Also, there is no time interval between a time at which the first light emitting device is turned off and a time at which the second light emitting device is turned on, or a predetermined time interval may be present therebetween.

Also, the preset period of time may be understood as a time required for capturing one image.

Meanwhile, when the plurality of light emitting devices are disposed in a plurality of sub-dies, the controller 180 (or the LD driver 180b) may group the plurality of light emitting devices by sub-dies.

At least one light emitting device may be provided (disposed) in each sub-die.

Also, the controller 180 may independently control the plurality of light emitting devices by sub-dies. In detail, the controller 180 may independently control the plurality of light emitting devices in units of sub-dies.

Here, controlling the plurality of light emitting devices by sub-dies may refer to grouping the plurality of light emitting devices by sub-dies and independently turning on or off the plurality of light emitting devices by sub-dies.

For example, the controller 180 may turn on only the light emitting devices included in a first sub-die among a plurality of sub-dies and may turn off light emitting devices included in the other remaining sub-dies excluding the first sub-die.

In another example, the controller 180 may simultaneously turn on or off the plurality of light emitting devices included in the plurality of sub-dies.

In another example, the controller 180 (or the LD driver 180b) may sequentially cause the plurality of light emitting devices to emit light (or sequentially turn on the plurality of light emitting devices) within a preset period of time according to preset order by the plurality of sub-dies.

For example, the controller 180 may turn on or off light emitting devices included in the first sub-die among the plurality of sub-dies for a predetermined period of time. Thereafter, when the light emitting devices included in the first sub-die are turned off, the controller 180 may turn on light emitting devices included in the second sub-die different from the first sub-die for a predetermined period of time and turn off the same.

The controller 180 may control the plurality of light emitting devices included in the plurality of sub-dies in units of sub-dies. Also, the controller 180 may cause the plurality of sub-dies to sequentially output light in preset order within a preset period of time.

Here, sequentially outputting light in preset order may refer to that durations in which light emitting devices included in different dies are turned on do not overlap.

The LD driver 180b may control the lighting device 200 to output light having a preset pattern (light pattern). As for a method for outputting light to have a preset pattern (light pattern), the contents described above with reference to FIGS. 3 to 8 may be inferred and applied in the same or similar manner.

Also, the depth processor 180a may receive an image by activating the camera 121. Also, the depth processor 180a may sense (extract or detect) an optical spot included in the received image and sense a light pattern formed by the sensed optical spot.

The depth processor 180a may extract depth information of the received image using the sensed light pattern. Here, extracting depth information of the image may include even extracting depth information regarding each of a plurality of regions included in the image.

For example, the depth processor 180a may use the structure light scheme of extracting depth information of the image by comparing the light pattern sensed from the image and a light pattern output from the lighting device 200.

Also, the depth processor 180a may use the ToF scheme of extracting depth information of the image on the basis of a time duration in which the sensed optical spot is output from the lighting device 200 and reflected by a subject so as to be returned to the sensing unit (camera).

Descriptions of extracting the depth information of the image by controlling the lighting device will be replaced with the descriptions above with reference to FIGS. 2 to 8.

Hereinafter, a die according to an embodiment of the present disclosure will be described in detail with reference to the accompanying drawings.

Figure 16B:
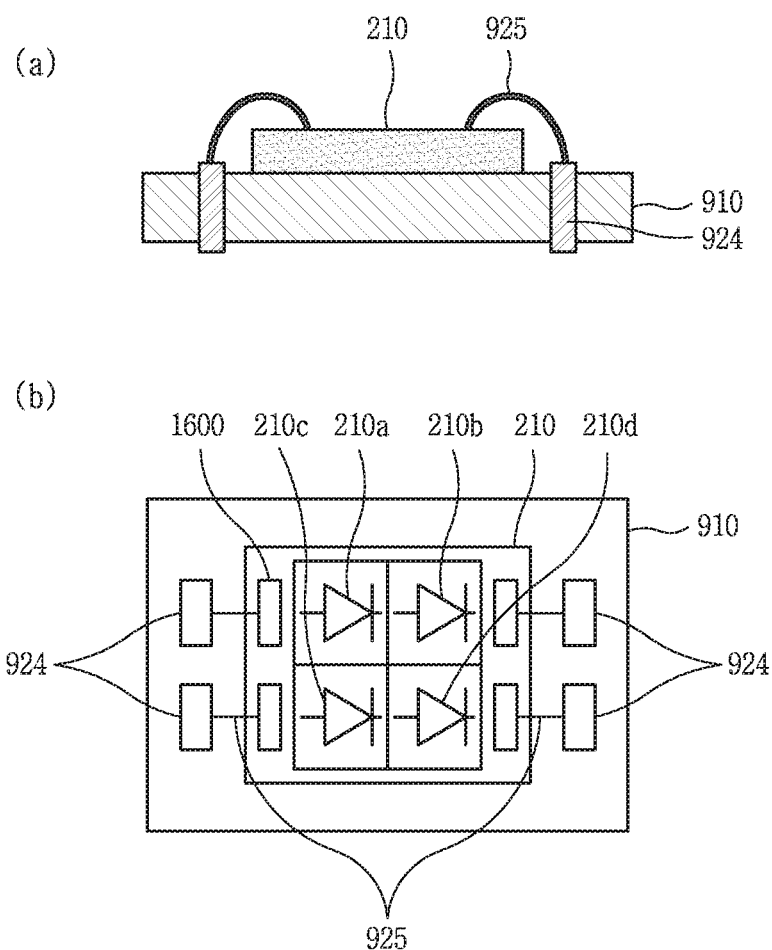

FIGS. 16A and 16B are conceptual views illustrating a structure in which a plurality of light emitting devices and a pad are connected according to an embodiment of the present disclosure.

As described above, a die 210 of the present disclosure may include a plurality of light emitting devices 210*a*, 210*b*, 210*c*, and 210*d*.

In order for the plurality of light emitting devices 210*a*, 210*b*, 210*c*, and 210*d* to emit light, an electrical signal is required. The electrical signal may be transmitted to the plurality of light emitting devices 210*a*, 210*b*, 210*c*, and 210*d* through an anode electrode and a cathode electrode.

As illustrated in (a) of FIG. 16A, the die 210 according to an embodiment of the present disclosure may include a plurality of anode electrodes A1, A2, A3, and A4, and a single cathode electrode C. A scheme in which the plurality of anode electrodes A1, A2, A3, and A4 and the single cathode electrode C are connected to the die 210 (or a plurality of light emitting devices) may be termed a common cathode scheme.

Meanwhile, as illustrated in (b) of FIG. 16A, the die 210 according to an embodiment of the present disclosure may include a plurality of cathode electrodes C1, C2, C3, and C4 and a single anode electrode A. A scheme in which the plurality of cathode electrodes C1, C2, C3, and C4 and the single anode electrode A to the die 210 (or a plurality of light emitting devices) may be termed a common anode scheme.

In the case of the common cathode scheme, as illustrated in (c) of FIG. 16A, the plurality of anode electrodes A1, A2, A3, and A4 electrically connected to the plurality of light emitting devices 210*a*, 210*b*, 210*c*, and 210*d* are provided on one surface of the die 210 and the single cathode electrode C electrically connected to the plurality of light emitting devices may be provided on the other surface opposing the one surface of the die 210.

In the case of the common anode scheme, as illustrated in (d) of FIG. 16A, the plurality of cathode electrodes C1, C2, C3, and C4 electrically connected to the plurality of light emitting devices 210*a*, 210*b*, 210*c*, and 210*d* may be provided on one surface of the die 210 and the single anode A electrically connected to the plurality of light emitting devices may be provided on the other surface opposing the one surface of the die 210.

The plurality of light emitting devices 210*a*, 210*b*, 210*c*, and 210*d* may be provided on one surface of the die 210. Also, a connector 1600 to be electrically connected to the plurality of anode electrodes A1, A2, A3, and A4 or the plurality of cathode electrodes C1, C2, C3, and C4 may be provided in the plurality of light emitting devices 210*a*, 210*b*, 210*c*, and 210*d*.

The connector 1600 may be the plurality of anode electrodes A1, A2, A3, and A4 or the plurality of cathode electrodes C1, C2, C3, and C4.

The plurality of anode electrodes A1, A2, A3, and A4 or the plurality of cathode electrodes C1, C2, C3, and C4 may be electrically connected to the pad 924 or the PCB 900 or 900*a* by a wire bonding.

For example, in cases where the plurality of anode electrodes A1, A2, A3, and A4 are disposed on one surface of the die 210, the plurality of anode electrodes A1, A2, A3, and A4 and the pad 924 may be connected by a wire bonding.

In another example, in cases where the plurality of cathode electrodes C1, C2, C3, and C4 are disposed on one surface of the die 210, the plurality of cathode electrodes C1, C2, C3, and C4 and the pad 924 may be connected by a wire bonding.

As in the third to fifth embodiments, if the die and the PCB are directly wire-bonded, the plurality of anode electrodes A1, A2, A3, and A4 (or the plurality of cathode electrodes C1, C2, C3, and C4) provided on one surface of the die 210 may be connected to the PCB 900 or 900*a* by a wire-bonding.

For example, as illustrated in (a) of FIG. 16B, in the light emitting device according to the first embodiment, for example, the plurality of anode electrodes A1, A2, A3, and A4 or the plurality of cathode electrodes C1, C2, C3, and C4 of the die 210 may be connected to the pad 924 inserted in the hole formed in the submount 910 by a wire bonding 925.

Referring to (b) of FIG. 16B, the plurality of light emitting devices 210*a*, 210*b*, 210*c*, and 210*d* may be electrically connected to a plurality of connectors 1600 by penetrating through the inside of the die 210 or through a surface of the die 210.

The plurality of anode electrodes A1, A2, A3, and A4 or the plurality of cathode electrodes C1, C2, C3, and C4 may be electrically connected to the connectors 1600, and the plurality of anode electrodes A1, A2, A3, and A4 or the plurality of cathode electrodes C1, C2, C3, and C4 may be connected to the pad 924 or the PCB 900 or 900*b* by a wire bonding 925.

That is, the pad 924 and the connector 1600 may be electrically connected by the wire bonding 925, and the wire bonding 925 may serve as a passage of the plurality of anode electrodes A1, A2, A3, and A4 or the plurality of cathode electrodes C1, C2, C3, and C4.

Also, the plurality of light emitting devices 210*a*, 210*b*, 210*c*, and 210*d* may be electrically connected to one cathode electrode c or one anode electrode A provided on the other surface of the die 210 through the inside of the die 210.

One cathode electrode C or one anode electrode A provided on the other surface of the die 210 may be electrically connected to the PCB 900 or 900*a* by way of the submount 910 or may be directly electrically connected to the PCB 900.

Through such a circuit structure, the present disclosure controls the plurality of light emitting devices by applying an electrical signal to the plurality of light emitting devices.

Figure 17:
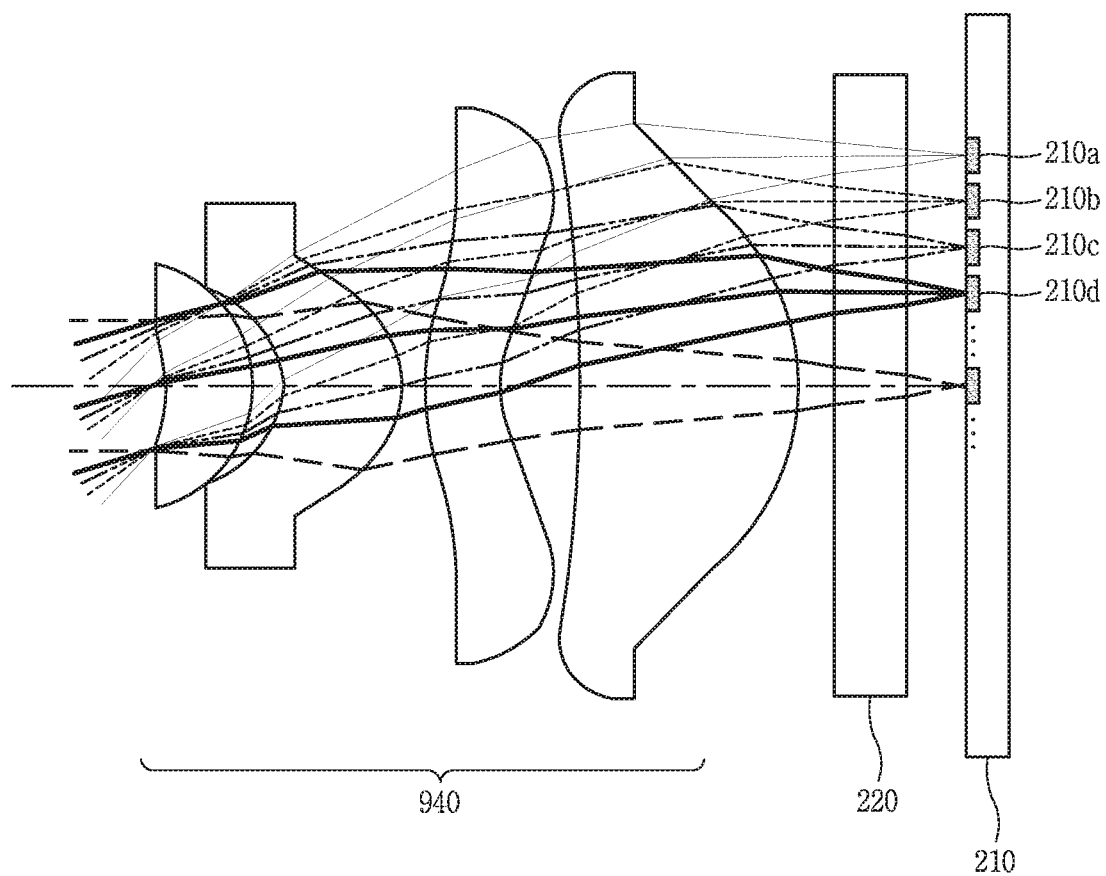
FIG. 17 is a conceptual view illustrating a lens according to an embodiment of the present disclosure.

FIG. 17 is a conceptual view illustrating a lens according to an embodiment of the present disclosure.

A lighting device related to the present disclosure may include a lens 940 provided in the holder 930. The holder 930 may include the holder according to the first to fifth embodiments of the present disclosure. That is, contents related to the lens 940 described hereinafter may be applied to the first to fifth embodiments described in this disclosure.

The holder 930 may have the lens 940 allowing light output from the plurality of light emitting devices provided in the die 210 to transmit therethrough. The lens 940 may include at least one of the microlens array 240, a reflective lens, a projection lens 230, a collimator lens, a grating cell array (GCA), a mirror/prism array, a fly eye lens, and a double refraction element.

The lens 940 may be formed to allow light which has been output from the plurality of light emitting devices 210*a*, 210*b*, 210*c*, and 210*d* or light which has passed through the DOE 220.

Here, the lens 940 related to the present disclosure may be a telecentric lens. The telecentric lens may refer to a lens in which incident light or exit light is parallel to an optical axis. In detail, the telecentric lens may refer to a lens in which an incident angle (CRA) condition of light incident to the lens is 0 in every field.

That is, when the incident angle of light incident to the lens is 0, it may mean that light is parallel to the optical axis.

By providing conditions in which light which has transmitted through the telecentric lens is vertically incident at an angle of 0 in every region, performance (efficiency) of the DOE may be increased.

Accordingly, the telecentric lens may provide the same magnification at every distance.

Here, the telecentric lens may be disposed between the plurality of light emitting devices and the DOE.

Also, the lighting device of the present disclosure may use a lens in which incident angle of light is not 0 degree, as well as the telecentric lens. In this case, a microlens array in which light (incident angle is 0 degree) emitted from the plurality of light emitting devices corresponds to an incident angle of a lens may be used.

Meanwhile, when the telecentric lens is used, a separate microlens array may be omitted, and thus, a structure may be simplified and cost may be reduced.

Figure 18:
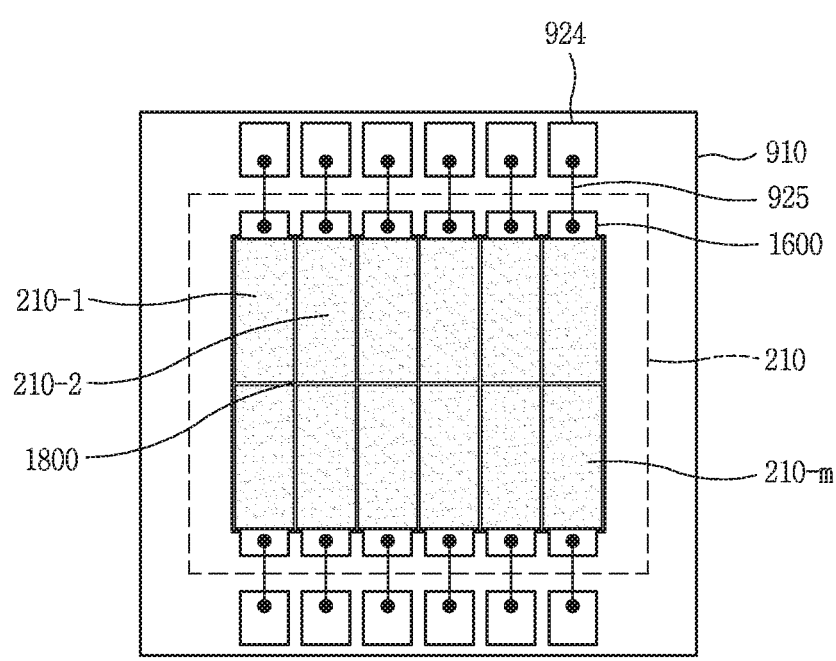

FIGS. 18 and 19 is a conceptual view illustrating a structure of a die according to an embodiment of the present disclosure.

A die 210 related to the present disclosure may include a plurality of sub-dies 210-1, 210-2, ..., 210-$m$ ($m$ is an even number). The plurality of light emitting devices may be disposed (provided) in the plurality of sub-dies 210-1, 210-2, ..., 210-$m$.

In order to apply an electric signal to the plurality of light emitting devices provided in the plurality of sub-dies 210-1, 210-2, ..., 210-$m$, a space 1800 allowing a circuit to be placed therein is required.

In the present disclosure, in order to minimize the space 1800, the plurality of sub-dies 210-1, 210-2, ..., 210-$m$ may be disposed in 2 columns and n rows or n columns and 2 rows (n is a natural number and n is m/2)

Circuits to be electrically connected to the plurality of light emitting devices are disposed between the plurality of sub-dies 210-1, 210-2, ..., 210-$m$. These circuits may be disposed in the aforementioned space 1800.

In cases where the plurality of sub-dies are disposed in 3 columns or greater and n rows or n columns or 3 rows or greater, a sub-die disposed therein may be present. Accordingly, in order to place a circuit on the sub-die disposed therein, an area of the space 1800 in which the circuits are place is increased.

Since the plurality of light emitting devices are not present in the space 1800, as the space 1800 is increased, an area in which light is output is reduced.

Meanwhile, in FIG. 18, it is illustrated that the die 210 includes a plurality of sub-dies, but the present disclosure is not limited thereto. That is, the die 210 may be formed as a plurality of blocks 210-1, 210-2, ..., 210-$m$ (m is an even number), and the plurality of light emitting devices may be provided in the plurality of blocks.

Also, the plurality of blocks 210-1, 210-2, ..., 210-$m$ may be disposed in a 2 columns and n rows or n columns and 2 rows (n is a natural number or n is m/2). Also, a space 1800 in which a circuit is placed is present between the plurality of blocks, and a circuit connected to the plurality of light emitting devices may be disposed (or printed) in the space 1800.

Accordingly, in the present disclosure, since the plurality of sub-dies (or plurality of blocks) included in the die 210 are disposed in 2 columns and n rows or n columns and 2 rows, the area of the space 1800 in which the circuit is placed may be minimized, providing a new lighting device in which an area to which light is output is increased.

As illustrated in FIG. 18, the plurality of sub-dies (or plurality of blocks) 210-1, 210-2, ..., 210-$m$ may be in contact with the connector 1600 through a circuit connected to the plurality of light emitting devices. Also, the connector 1600 may be connected to the pad 924 (or the PCB 900) inserted to penetrate through the submount 910 by the wire bonding 925.

Referring to FIG. 19, the lighting device of the present invention (e.g., a size of the submount) may have a size of about 3*3*0.6 mm. That is, the lighting device of the present invention may have a small size so as to be easily installed in a mobile terminal.

For example, as illustrated in (a) and (b) of FIG. 19, the lighting device may have a width of 3.25 mm, a length of 3 mm, and a height of 0.445±0.042 mm. The height may be about 0.6 mm, considering a height of a wire bonding connecting the connector and the pad.

In addition, the die 210 in which a plurality of light emitting devices are provided may have a size of 1.762 mm in width and 1.322 mm in length.

FIG. 19 illustrates standards of the submount 910, the die 210 provided in the submount, and the pad 924 inserted to penetrate through the submount 910, and dimensions (or numerical values) regarding positions where the components are disposed.

The numerical values illustrated in FIG. 19 may be in units of mm.

The numerical values illustrated in FIG. 19 are numerical values according to an embodiment and a size of the lighting device of the present invention is not limited thereto.

As described above, the die 210 of the present invention may include a plurality of sub-dies 210-1, 210-2, ..., 210-$m$, and the plurality of sub-dies may be disposed in two columns and n rows or n columns and two rows.

Accordingly, a gap may not exist between the plurality of sub-dies. That is, the plurality of sub-dies may be arranged contiguously.

In other words, the plurality of light emitting devices provided in the die 210 are arranged in a preset pattern in the single die 210, and may be distinguished into two columns and n rows or n columns and two rows so as to be operated.

In the present invention, since the sub-dies are disposed without a gap therebetween, optical loss (or loss of resolution of light irradiated to a subject to extract depth information) of the plurality of light beams irradiated to extract depth information may be minimized.

If there is a gap between the plurality of sub-dies, since a light emitting device is not present in the gap, light is not irradiated to the subject to correspond to the gap. Further, in the present invention, since a gap is eliminated between the plurality of sub-dies, the size of the lighting device may be reduced, and thus, cost incurred for manufacturing the lighting device may also be significantly reduced.

The plurality of sub-dies (i.e., the die of the present invention) may be provided with about 2400 light emitting devices (e.g., VCSELs), and as illustrated in FIG. 19, when 12 sub-dies are provided (12 divided blocks are provided), each sub-die may have 200 or more light emitting devices.

In the present invention, it is possible to irradiate a subject with light spots (or light points) greater than the number of light emitting devices provided on the die by using a diffractive optical element.

Further, according to the present invention, as the number of light emitting devices is reduced, power applied to each light emitting device may be increased to increase brightness of each light emitting device (i.e., intensity of light output from each light emitting device may be further increased).

In addition, in the present invention, weakening of intensity of light when light is duplicated using the diffractive optical element may be compensated by increasing intensity of light according to a reduction in the number of light emitting devices.

Further, in the present invention, since a small number of light emitting devices are used, cost incurred for manufacturing the lighting device and a size of the lighting device may be reduced, and thus, the lighting device which can be applied to various devices may be provided.

Meanwhile, as illustrated in (a) of FIG. 19, in the present invention, when 12 sub-dies are arranged (or when a plurality of light emitting devices provided in the die are divided into 12 blocks), twelve pads 924 and twelve connectors 1600 may be provided.

The twelve pads may be arranged to be spaced apart from each other, the twelve connectors may be connected to the twelve sub-dies, and the twelve connectors may be spaced apart from each other.

Here, alignment marks may be formed on any one pad 924a and any one connector 1600a wire-bonded to the pad 924a.

In other words, since the lighting device of the present invention is symmetrical vertically and bilaterally, alignment marks may be formed on one pad 924a and one connector 1600a wire-bonded to the pad 924a in order to identify a direction in which the lighting device is to be mounted.

For example, the alignment marks may have a shape in which the edge portion is cut, as shown in (a) of FIG. 19.

Further, the connector 1600 connected to each of the plurality of sub-dies may be electrically connected to the pad 924 through two wire bonding.

That is, the connector and the pad may be connected by two wire bonding, respectively.

As illustrated in (c) of FIG. 19, in the lighting device of the present invention, for example, an electrical signal may be applied to the plurality of light emitting devices according to a common cathode scheme in which one cathode electrode is connected to a rear surface of the die (a plurality of sub-dies) and an anode electrode in twelve pads 924.

Meanwhile, the mobile terminal of the present disclosure may include the lighting device described in this disclosure.

According to the present disclosure, since the die and the PCB are electrically connected through the submount, a configuration in which the submount and the PCB are wire-bonded may be omitted. That is, the present disclosure does not require such a configuration of wire-bonding the submount and the PCB as in the related art.

Accordingly, a volume required for wire-bonding the submount and the PCB is reduced, minimizing a volume of the lighting device.

Also, the present disclosure may provide a new lighting device including various structures capable of effectively dissipating heat generated by the plurality of light emitting devices.

The present invention described above may be implemented as a computer-readable code in a medium in which a program is recorded. The computer-readable medium includes any type of recording device in which data that can be read by a computer system is stored. The computer-readable medium may be, for example, a hard disk drive (HDD), a solid state disk (SSD), a silicon disk drive (SDD), a ROM, a RAM, a CD-ROM, a magnetic tape, a floppy disk, an optical data storage device, and the like. The computer-readable medium also includes implementations in the form of carrier waves (e.g., transmission via the Internet). Also, the computer may include the controller 180 of the terminal. Thus, the foregoing detailed description should not be interpreted limitedly in every aspect and should be considered to be illustrative. The scope of the present invention should be determined by reasonable interpretations of the attached claims and every modification within the equivalent range are included in the scope of the present invention.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A lighting device comprising:
a die including a plurality of light emitting devices;
a printed circuit board (PCB) electrically connected to the die;
a submount connected to the PCB; and
a pad inserted into a hole formed in the submount such that the die and the PCB are electrically connected through the submount, connected to the die by a wire bonding, and electrically connected to the PCB,
wherein heat generated in the die is dissipated through the submount and the PCB.

2. The lighting device of claim 1, wherein the submount is mounted on the PCB and the die is mounted on the submount.

3. The lighting device of claim 1, wherein the plurality of light emitting devices provided in the die and the PCB are electrically connected by penetrating through the submount through the pad inserted into the submount.

4. The lighting device of claim 1, further comprising:
a holder disposed on the submount, provided to cover the die, and having an internal space.

5. The lighting device of claim 4, wherein heat generated in the die is dissipated through a side surface of the submount and the PCB.

6. The lighting device of claim 4, further comprising:
a diffractive optical element (DOE) disposed in the internal space and disposed by the holder.

7. The lighting device of claim 1, further comprising:
a holder provided on the PCB and formed to cover the die and the submount.

8. The lighting device of claim 7, wherein the holder is provided to have an internal space between the die and the holder.

9. The lighting device of claim 8, further comprising:
a diffractive optical element (DOE) disposed in the internal space and disposed by the holder.

10. A lighting device comprising:
a first printed circuit board (PCB);

a die including a plurality of light emitting devices, the first PCB electrically connected to the die, wherein the die is mounted on the first PCB formed as a metal member, and the die and the first PCB are connected by a wire bonding; and a second PCB disposed to be spaced apart from the first PCB by a predetermined distance and electrically connected to the first PCB through a cable.

11. The lighting device of claim 10, further comprising: a holder disposed on the first PCB, provided to cover the die, and having an internal space.

12. The lighting device of claim 10, wherein heat generated in the die is dissipated through the first PCB as the metal member.

13. The lighting device of claim 1, wherein a plurality of anode electrodes electrically connected to the plurality of light emitting devices are provided on one surface of the die, and a single cathode electrode electrically connected to the plurality of light emitting devices is provided on the other surface opposing the one surface of the die.

14. The lighting device of claim 13, wherein the plurality of anode electrodes and the pad are connected by a wire bonding.

15. The lighting device of claim 1, wherein a plurality of cathode electrodes electrically connected to the plurality of light emitting devices are provided on one surface of the die, and a single anode electrode electrically connected to the plurality of light emitting devices is provided on the other surface opposing the one surface of the die.

16. The lighting device of claim 4, wherein a lens allowing light output from the plurality of light emitting devices provided in the die to transmit therethrough is provided in the holder.

17. The lighting device of claim 16, wherein the lens is a telecentric lens.

* * * * *